(12) United States Patent
Iwashita et al.

(10) Patent No.: US 7,291,960 B2
(45) Date of Patent: Nov. 6, 2007

(54) PIEZOELECTRIC DEVICE, PIEZOELECTRIC ACTUATOR, PIEZOELECTRIC PUMP, INKJET RECORDING HEAD, INKJET PRINTER, SURFACE ACOUSTIC WAVE DEVICE, THIN-FILM PIEZOELECTRIC RESONATOR, FREQUENCY FILTER, OSCILLATOR, ELECTRONIC CIRCUIT, AND ELECTRONIC INSTRUMENT

(75) Inventors: Setsuya Iwashita, Nirasaki (JP); Takeshi Kijima, Matsumoto (JP); Koji Ohashi, Chino (JP)

(73) Assignee: Seiko Epson Corporation (JP)

( * ) Notice: Subject to any disclaimer, the term of this patent is extended or adjusted under 35 U.S.C. 154(b) by 41 days.

(21) Appl. No.: 11/304,938

(22) Filed: Dec. 15, 2005

(65) Prior Publication Data

US 2006/0138906 A1 Jun. 29, 2006

(30) Foreign Application Priority Data

Dec. 28, 2004 (JP) .............................. 2004-380989

(51) Int. Cl.
*H01L 41/047* (2006.01)
(52) U.S. Cl. ...................... 310/363; 310/364
(58) Field of Classification Search ................ 310/363, 310/364
See application file for complete search history.

(56) References Cited

U.S. PATENT DOCUMENTS 5,995,359 A 11/1999 Klee et al.
6,642,539 B2 * 11/2003 Ramesh et al. ............... 257/43
2003/0008179 A1 1/2003 Lee et al.
2003/0062553 A1 * 4/2003 Ramesh et al. ............. 257/295
2006/0227489 A1 * 10/2006 Bunyan et al. ............. 361/160

FOREIGN PATENT DOCUMENTS

| CN | 1544963 | * | 11/2004 |
| CN | 1758432 A | * | 4/2006 |
| EP | 1 560 280 | | 8/2005 |
| JP | 2001-223404 | | 8/2001 |
| JP | 2004-66600 A | * | 8/2002 |
| WO | WO 2004/042836 | | 5/2004 |
| WO | WO-2005-062803 | * | 7/2005 |

OTHER PUBLICATIONS

Communication from European Patent Office regarding related application.
"Microstructures and Electrical Characteristics of PZT Thin Films Deposited on Stainless Steel Using a LaNiO3 Buffer Layer", Yun Liu and Chao-Nan Xu, Asian Ceramic Science for Electronics 1, National Institute of Advanced Industrial Science and Technology, Kyushu, Shuku, 807-1, Tosu, Saga, 841-0052 Japan (pp. 117-121).

(Continued)

*Primary Examiner*—Thomas M. Dougherty
(74) *Attorney, Agent, or Firm*—Harness, Dickey & Pierce, P.L.C.

(57) ABSTRACT

A piezoelectric device including: a substrate; a first conductive layer formed over the substrate, the first conductive layer including a conductive oxide layer formed of a (001) preferentially oriented lanthanum nickelate, and the lanthanum nickelate having oxygen deficiency; a piezoelectric layer formed over the first conductive layer and including a piezoelectric having a perovskite structure; and a second conductive layer electrically connected with the piezoelectric layer.

18 Claims, 14 Drawing Sheets

OTHER PUBLICATIONS

"Structural, dielectric, and ferroelectric properties of compositionally graded (Pb, La) $TiO_3$ thin films with conductive $LaNiO_3$ bottom electrodes", Applied Physics Letters, vol. 77, No. 7, Dinghua Bao, Mizutani, Yao and Zhang, Aug. 14, 2000 (pp. 1041-1043).

"Preparation and characterization of preferred oriented PZT films on amorphous substrates", Yun Liu, Chao-Nan Xu, T. Watanabe, Kyushu National Industrial Research Institute, 807-1, Shuku, Tosu, Saga, 841-0052, Japan (pp. 4129-4132).

Electrical properties and crystal structure of (Ba, Sr) $TiO_3$ films prepared at low temperatures on a $LaNiO_3$ electrode by radio-frequency magnetron sputtering, Chung Ming Chu and Pang Lin, 1997 American Institute of Physics, Appl. Phys. Lett. 70 (2), Jan. 13, 1997 (pp. 249-251).

"Effect of textured $LaNiO_3$ electrode on the fatigue improvement of $Pb(Zr_{0.53}Ti_{0.47})$ thin films", Ming-Sen Chen, Tai-Bor Wu and Jenn-Ming Wu,1996 American Institute of Physics, Appl. Phys. Lett. 68 (10), Mar. 4, 1996 (pp. 1430-1432).

Oxygen Nonstoichiometry and Its Effect on the Structure of $LaNiO_3$, Soma Rakshit and P.S. Gopalakrishnan, Journal of Solid State Chemistry 110, 28-31 (1994) (pp. 28-31).

Microstructural Characterization of the $LaNiO_{3-\gamma}$ System, M.J. Sayagues, M. Vallet-Regi, A. Caneiro, and J.M. Gonzalez-Calbet, Journal of Solid State Chemistry 110, 295-304 (1994) (pp. 295-304).

Influence of oxygen stoichiometry on the electronic properties of $La_4Ni_3O_{10\pm\delta}$, M.D. Carvalho, M. M. Cruz, A. Wattiaux and J. M. Bassat, F. M. A. Costa, M. Godinho, Journal of Applied Physics, vol. 88, No. 1, Jul. 2000 (pp. 544-549).

"Low-Temperature growth of epitaxial $LaNiO_3/Pb(Zr_{0.52}Ti_{0.48})$ $O_3/LaNiO_3$ on Si(001) by pulsed-laser deposition" Wenbin Wu, K.H. Wong and C.L. Choy, 2000 American Vacuum Society, J. Vac. Sci. Technol.A 18(1), Jan./Feb. 2000, (pp. 79-82).

Communication from European Patent Office regarding related application, Apr. 25, 2006.

"Microstructures and Electrical Characteristics of PZT Thin Films Deposited on Stainless Steel Using a LaNiO3 Buffer Layer", Yun Liu and Chao-Nan Xu, Asian Ceramic Science for Electronics I, National Institute of Advanced Industrial Science and Technology, Kyushu, Shuku, 807-1, Tosu, Saga, 841-0052 Japan (pp. 117-121) 2002.

"Structural, dielectric, and ferroelectric properties of compositionally graded (Pb, La) $TiO_3$ thin films with conductive $LaNiO_3$ bottom electrodes", Applied Physics Letters, vol. 77, No. 7, Dinghua Bao, Mizutani, Yao and Zhang, Aug. 14, 2000 (pp. 1041-1043).

"Preparation and characterization of preferred oriented PZT films on amorphous substrates", Yun Liu, Chao-Nan Xu, T. Watanabe, Kyushu National Industrial Research Institute, 807-1, Shuku, Tosu, Saga, 841-0052, Japan (pp. 4129-4132) Sep. 1, 1999.

Electrical properties and crystal structure of (Ba, Sr) $TiO_3$ films prepared at low temperatures on a $LaNiO_3$ electrode by radio-frequency magnetron sputtering. Chung Ming Chu and Pang Lin, 1997 American Institute of Physics, Appl. Phys. Lett. 70 (2), Jan. 13, 1997 (pp. 249-251).

* cited by examiner

PIEZOELECTRIC DEVICE, PIEZOELECTRIC ACTUATOR, PIEZOELECTRIC PUMP, INKJET RECORDING HEAD, INKJET PRINTER, SURFACE ACOUSTIC WAVE DEVICE, THIN-FILM PIEZOELECTRIC RESONATOR, FREQUENCY FILTER, OSCILLATOR, ELECTRONIC CIRCUIT, AND ELECTRONIC INSTRUMENT

Japanese Patent Application No. 2004-380989, filed on Dec. 28, 2004, is hereby incorporated by reference in its entirety.

BACKGROUND OF THE INVENTION

The present invention relates to a piezoelectric device, a piezoelectric actuator, a piezoelectric pump, an inkjet recording head, an inkjet printer, a surface acoustic wave device, a thin-film piezoelectric resonator, a frequency filter, an oscillator, an electronic circuit, and an electronic instrument.

An inkjet printer has been known as a printer enabling high-quality and high-speed printing. An inkjet printer includes an inkjet recording head having cavities of which the internal volume changes, and prints an image by ejecting ink droplets from nozzles while moving the head. As a head actuator for the inkjet recording head used for the inkjet printer, a piezoelectric device including a layer of a piezoelectric represented by PZT ($Pb(Zr,Ti)O_3$) has been used (e.g. JP-A-2001-223404).

An improvement of characteristics has also been demanded for other devices including a piezoelectric layer. Therefore, provision of a piezoelectric layer exhibiting excellent piezoelectric characteristics has been demanded.

SUMMARY

According to a first aspect of the invention, there is provided a piezoelectric device comprising:

a substrate;

a first conductive layer formed over the substrate, the first conductive layer including a conductive oxide layer formed of a (001) preferentially oriented lanthanum nickelate, and the lanthanum nickelate having oxygen deficiency;

a piezoelectric layer formed over the first conductive layer and including a piezoelectric having a perovskite structure; and a second conductive layer electrically connected with the piezoelectric layer.

According to a second aspect of the invention, there is provided a piezoelectric actuator comprising the above-described piezoelectric device.

According to a third aspect of the invention, there is provided a piezoelectric pump comprising the above-described piezoelectric device.

According to a fourth aspect of the invention, there is provided an inkjet recording head comprising the above-described piezoelectric device.

According to a fifth aspect of the invention, there is provided an inkjet printer comprising the above-described inkjet recording head.

According to a sixth aspect of the invention, there is provided a surface acoustic wave device comprising the above-described piezoelectric device.

According to a seventh aspect of the invention, there is provided a thin-film piezoelectric resonator comprising the above-described piezoelectric device.

According to an eighth aspect of the invention, there is provided a frequency filter comprising at least one of the above-described surface acoustic wave device and the above-described thin-film piezoelectric resonator.

According to a ninth aspect of the invention, there is provided an oscillator comprising at least one of the above-described surface acoustic wave device and the above-described thin-film piezoelectric resonator.

According to a tenth aspect of the invention, there is provided an electronic circuit comprising at least one of the above-described frequency filter and the above-described oscillator.

According to an eleventh aspect of the invention, there is provided an electronic instrument comprising at least one of the above-described piezoelectric pump and the above-described electronic circuit.

DETAILED DESCRIPTION OF THE EMBODIMENT

Figure 1:
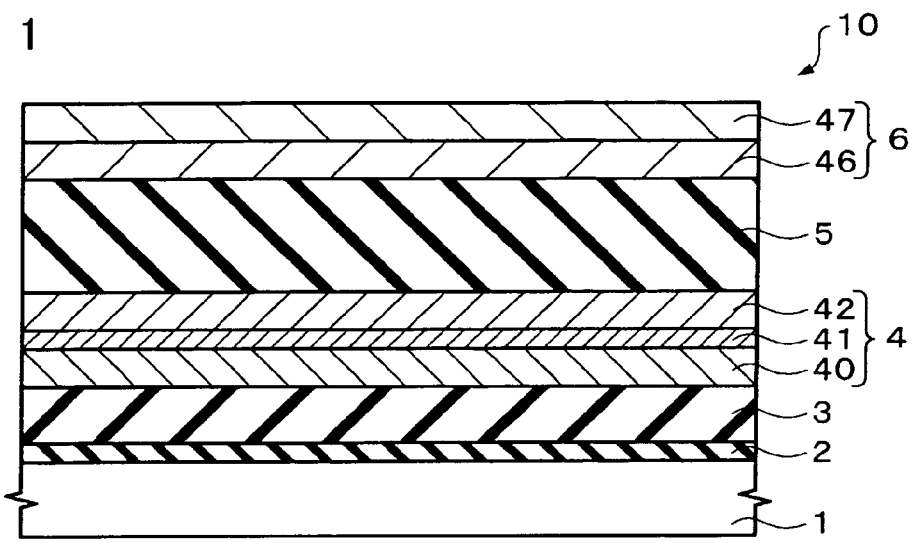
FIG. 1 is a cross-sectional view schematically showing a piezoelectric device according to a first embodiment of the invention.

The invention may provide a piezoelectric device exhibiting excellent piezoelectric characteristics. The invention may also provide a piezoelectric actuator, a piezoelectric pump, an inkjet recording head, an inkjet printer, a surface acoustic wave device, a thin-film piezoelectric resonator, a frequency filter, an oscillator, an electronic circuit, and an electronic instrument using the piezoelectric device.

According to one embodiment of the invention, there is provided a piezoelectric device comprising:

a substrate;

a first conductive layer formed over the substrate, the first conductive layer including a conductive oxide layer formed of a (001) preferentially oriented lanthanum nickelate, and the lanthanum nickelate having oxygen deficiency;

a piezoelectric layer formed over the first conductive layer and including a piezoelectric having a perovskite structure; and a second conductive layer electrically connected with the piezoelectric layer.

This piezoelectric device exhibits excellent piezoelectric characteristics. The reasons therefor are as follows.

In this piezoelectric device, lanthanum nickelate forming the conductive oxide layer has oxygen deficiency. The lattice constant of lanthanum nickelate forming the conductive oxide layer can be caused to become closer to the lattice constant of a piezoelectric forming the piezoelectric layer by appropriately determining the amount of oxygen deficiency of lanthanum nickelate corresponding to the type of material for the piezoelectric layer formed over the conductive oxide layer. Specifically, a lattice mismatch between the piezoelectric layer and the conductive oxide layer can be reduced. As a result, stress applied to the piezoelectric layer can be reduced. This enables the piezoelectric device to be provided with a piezoelectric layer having a high piezoelectric constant and producing a large amount of deformation upon application of voltage. Specifically, this piezoelectric device exhibits excellent piezoelectric characteristics.

In this embodiment, the term "piezoelectric having a perovskite structure" includes a piezoelectric having a perovskite structure and a piezoelectric having a layered perovskite structure.

In this embodiment, the term "preferential orientation" includes the case where 100% of the crystals have a desired orientation (e.g. (001) orientation) and the case where most (e.g. 90% or more) of the crystals have a desired orientation and the remaining crystals have other orientations (e.g. (111) orientation).

In this embodiment, a specific substance (hereinafter called "B") formed over another specific substance (hereinafter called "A") includes B directly formed over A and B formed over A through another substance provided on A. In the embodiment of the invention, the statement "forming B over A" includes the case of directly forming B over A and the case of forming B over A through another substance provided on A.

In this piezoelectric device, the first conductive layer may include at least one buffer layer formed of a (001) preferentially oriented lanthanum-based layered perovskite compound; and the lanthanum-based layered perovskite compound may include at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$.

In this piezoelectric device, the first conductive layer may include at least one low-resistivity layer formed of a conductive material having a resistivity lower than a resistivity of the lanthanum nickelate.

In this piezoelectric device, the conductive material may include at least one of a metal, an oxide of the metal, and an alloy of the metal; and the metal may be at least one of Pt, Ir, Ru, Ag, Au, Cu, Al, and Ni.

In this piezoelectric device, the first conductive layer may include the low-resistivity layer, the buffer layer formed over the low-resistivity layer, and the conductive oxide layer formed over the buffer layer.

In this piezoelectric device, the conductive oxide layer may be in contact with the piezoelectric layer.

In this piezoelectric device, the piezoelectric may be shown by a general formula $ABO_3$, A including Pb, and B including at least one of Zr and Ti.

In this piezoelectric device, B may further include Nb.

In this piezoelectric device, the piezoelectric may be a rhombohedral crystal or a mixed crystal of a tetragonal crystal and a rhombohedral crystal and be (001) preferentially oriented.

According to one embodiment of the invention, there is provided a piezoelectric actuator comprising the above-described piezoelectric device.

According to one embodiment of the invention, there is provided a piezoelectric pump comprising the above-described piezoelectric device.

According to one embodiment of the invention, there is provided an inkjet recording head comprising the above-described piezoelectric device.

According to one embodiment of the invention, there is provided an inkjet printer comprising the above-described inkjet recording head.

According to one embodiment of the invention, there is provided a surface acoustic wave device comprising the above-described piezoelectric device.

According to one embodiment of the invention, there is provided a thin-film piezoelectric resonator comprising the above-described piezoelectric device.

According to one embodiment of the invention, there is provided a frequency filter comprising at least one of the above-described surface acoustic wave device and the above-described thin-film piezoelectric resonator.

According to one embodiment of the invention, there is provided an oscillator comprising at least one of the above-described surface acoustic wave device and the above-described thin-film piezoelectric resonator.

According to one embodiment of the invention, there is provided an electronic circuit comprising at least one of the above-described frequency filter and the above-described oscillator.

According to one embodiment of the invention, there is provided an electronic instrument comprising at least one of the above-described piezoelectric pump and the above-described electronic circuit.

These embodiments of the invention will be described below, with reference to the drawings.

FIRST EMBODIMENT

A piezoelectric device 10 according to a first embodiment is described below.

FIG. 1 is a cross-sectional view showing the piezoelectric device 10. The piezoelectric device 10 includes a substrate 1, a stopper layer 2 formed over the substrate 1, a hard layer 3 formed over the stopper layer 2, a first conductive layer 4 formed over the hard layer 3, a piezoelectric layer 5 formed over the first conductive layer 4, and a second conductive layer 6 formed over the piezoelectric layer 5.

As the substrate 1, a (110) oriented silicon substrate or the like may be used. As the stopper layer 2, a silicon oxide layer or the like may be used. The stopper layer 2 may function as an etching stopper in a step of etching the substrate 1 from the back side when forming ink cavities 521 of an inkjet recording head 50 (see FIG. 9), for example. The stopper layer 2 and the hard layer 3 function as an elastic layer 55 in the inkjet recording head 50. As the material for the hard layer 3, yttrium-stabilized zirconia, cerium oxide, zirconium oxide, or the like may be used.

The first conductive layer 4 includes a low-resistivity layer 40, a buffer layer 41 formed over the low-resistivity layer 40, and a conductive oxide layer 42 formed over the buffer layer 41. The first conductive layer 4 is one electrode for applying voltage to the piezoelectric layer 5. The first conductive layer 4 may be formed to have a planar shape the same as that of the piezoelectric layer 5, for example.

The low-resistivity layer 40 is formed of a conductive material having a resistivity lower than that of lanthanum nickelate. The conductive material may include at least one of a metal, a metal oxide, and an alloy, for example. As the metal, at least one of Pt, Ir, Ru, Ag, Au, Cu, Al, and Ni may be used, for example. As examples of the metal oxide, $IrO_2$, $RuO_2$, and the like can be given. As examples of the alloy, Pt—Ir, Ir—Al, Ir—Ti, Pt—Ir—Al, Pt—Ir—Ti, Pt—Ir—Al—Ti, and the like can be given. In the first embodiment, the crystal orientation of the conductive material is not particularly limited. The conductive material may be (111) oriented, for example. The thickness of the low-resistivity layer 40 may be about 50 to 150 nm, for example.

The buffer layer 41 may be formed of a (001) preferentially oriented lanthanum-based layered perovskite compound (hereinafter called "La-layered compound"). The La-layered compound may include at least one of $La_2NiO_4$, $La_3Ni_2O_7$, $La_4Ni_3O_{10}$, $La_2CuO_4$, and a solid solution of at least two of these compounds. It is preferable that the A site of the La-layered compound be replaced with Pb. This enables the crystallization temperature to be reduced. This measure is particularly effective when forming the buffer layer 41 by using a sol-gel method. The amount of the A site replaced with Pb may be 10 at % or less taking the conductivity of the buffer layer 41 into consideration. The thickness of the buffer layer 41 may be about 10 to 50 nm, for example.

The conductive oxide layer 42 is in contact with the piezoelectric layer 5. The conductive oxide layer 42 is formed of lanthanum nickelate. Lanthanum nickelate forming the conductive oxide layer 42 has oxygen deficiency. Specifically, lanthanum nickelate in this case is shown by the chemical formula $LaNiO_{3-x}$. x indicates the amount of oxygen deficiency. The lattice constant of lanthanum nickelate is increased as the amount of oxygen deficiency is increased (i.e. x is increased). For example, the lattice constant of $LaNiO_3$ is about 0.384 nm, the lattice constant of $LaNiO_{2.5}$ (x=0.5) is about 0.390 nm, and the lattice constant of $LaNiO_2$ (x=1) is about 0.396 nm. Specifically, the lattice constant of lanthanum nickelate forming the conductive oxide layer 42 can be caused to become closer to the lattice constant of a piezoelectric forming the piezoelectric layer 5 by appropriately determining the amount of oxygen deficiency of lanthanum nickelate corresponding to the type of material for the piezoelectric layer 5 formed over the conductive oxide layer 42. Specifically, a lattice mismatch between the piezoelectric layer 5 and the conductive oxide layer 42 can be reduced. As a result, stress applied to the piezoelectric layer 5 can be reduced. For example, when the piezoelectric layer 5 is formed of lead zirconate titanate $(Pb(Zr,Ti)O_3)$, it is preferable that the amount "x" of oxygen deficiency be in the range of "$0<x\leq1$" taking the conductivity of the conductive oxide layer 42 into consideration. Note that the lattice constant of lead zirconate titanate $(Pb(Zr,Ti)O_3)$ is about 0.4 nm.

$LaNiO_{3-x}$ forming the conductive oxide layer 42 is (001) preferentially oriented. The crystal orientation of $LaNiO_{3-x}$ is random in the plane direction. $LaNiO_{3-x}$ tends to exhibit (001) self-orientation. It is preferable that the A site of $LaNiO_{3-x}$ be replaced with Pb. This enables the crystallization temperature to be reduced. This measure is particularly effective when forming the conductive oxide layer 42 by using a sol-gel method. Moreover, the lattice constant of the conductive oxide becomes closer to the lattice constant of the piezoelectric forming the piezoelectric layer 5 by replacing the A site of $LaNiO_{3-x}$ with Pb. Specifically, a lattice mismatch between the conductive oxide layer 42 and the piezoelectric layer 5 can be reduced. The amount of the A site replaced with Pb may be 10 at % or less taking the conductivity of the conductive oxide layer 42 into consideration. The thickness of the conductive oxide layer 42 may be about 0 to 140 nm, for example.

The piezoelectric layer 5 is formed of a piezoelectric having a perovskite structure. The piezoelectric layer 5 is in contact with the conductive oxide layer 42. It is preferable that the piezoelectric forming the piezoelectric layer 5 be a rhombohedral crystal or a mixed crystal of a tetragonal crystal and a rhombohedral crystal and be (001) preferentially oriented. The piezoelectric layer 5 formed of such a piezoelectric has a high piezoelectric constant.

The piezoelectric may be shown by the general formula $ABO_3$, for example. A may include Pb, and B may include at least one of Zr and Ti. B may also include at least one of V, Nb, and Ta. In this case, the piezoelectric may include at least one of Si and Ge. In more detail, the piezoelectric may include at least one of lead zirconate titanate $(Pb(Zr,Ti)O_3)$, lead niobate zirconate titanate $(Pb(Zr,Ti,Nb)O_3)$, lead lanthanum titanate $((Pb,La)TiO_3)$, lead lanthanum zirconate titanate $((Pb,La)ZrTiO_3)$, lead magnesium niobate titanate $(Pb(Mg,Nb)TiO_3)$, lead magnesium niobate zirconate titanate $(Pb(Mg,Nb)(Zr,Ti)O_3)$, lead zinc niobate titanate $(Pb(Zn,Nb)TiO_3)$, lead scandium niobate titanate $(Pb(Sc,Nb)TiO_3)$, and lead nickel niobate titanate $(Pb(Ni,Nb)TiO_3)$. For example, lead niobate zirconate titanate $(Pb(Zr,Ti,Nb)O_3)$ is obtained by replacing some of the Zr in the B site of lead zirconate titanate (Pb(Zr$_x$Ti$_y$)O$_3$ (x+y=1)) with Nb, and may be shown by Pb(Zr$_{x-z}$Nb$_z$Ti$_y$)O$_3$. It is preferable that the compositional ratio of the B site be $0.4 \leq x \leq 0.6$, $0.6 \geq y \geq 0.4$, and $0 < z \leq 0.3$. If x, y, and z are within the above-mentioned ranges, x, y, and z have values at or in the vicinity of the morphotropic phase boundary (MPB) of the crystal structure of the piezoelectric layer 5. The morphotropic phase boundary is the boundary at which a phase transition occurs between a rhombohedral crystal and a tetragonal crystal. The piezoelectric constant (d$_{31}$) becomes maximum in the vicinity of the morphotropic phase boundary. Therefore, if x, y, and z are within the above-mentioned ranges, the piezoelectric layer 5 can be easily controlled to be a rhombohedral crystal or a mixed crystal of a tetragonal crystal and a rhombohedral crystal, so that the piezoelectric layer 5 exhibits excellent piezoelectric characteristics.

The piezoelectric may include at least one of (Ba$_{1-x}$Sr$_x$)TiO$_3$ ($0 \leq x \leq 0.3$), Bi$_4$Ti$_3$O$_{12}$, SrBi$_2$Ta$_2$O$_9$, LiNbO$_3$, LiTaO$_3$, and KNbO$_3$, for example. The thickness of the piezoelectric layer 5 may be about 400 to 5000 nm, for example.

The second conductive layer 6 includes a conductive oxide layer (hereinafter called "second conductive oxide layer") 46 and a low-resistivity layer (hereinafter called "second low-resistivity layer") 47 formed over the second conductive oxide layer 46. The second conductive layer 6 is the other electrode for applying voltage to the piezoelectric layer 5. Since the second conductive layer 6 includes the second conductive oxide layer 46 and the second low-resistivity layer 47, the second conductive layer 6 and the first conductive layer 4 can be made almost symmetrical with respect to the piezoelectric layer 5. Specifically, the symmetry of the piezoelectric device 10 can be improved. The second conductive layer 6 may include only one of the second conductive oxide layer 46 and the second low-resistivity layer 47. The second conductive layer 6 may be formed to have a planar shape the same as that of the piezoelectric layer 5, for example.

The second conductive oxide layer 46 may be formed of a conductive oxide having a perovskite structure, for example. The conductive oxide may include at least one of CaRuO$_3$, SrRuO$_3$, BaRuO$_3$, SrVO$_3$, (La,Sr)MnO$_3$, (La,Sr)CrO$_3$, (La,Sr)CoO$_3$, LaNiO$_3$, and a solid solution of at least two of these compounds. The thickness of the second conductive oxide layer 46 may be about 0 to 200 nm, for example.

The second low-resistivity layer 47 may be formed of a conductive material having a resistivity lower than that of the second conductive oxide, for example. As the conductive material, the above-mentioned conductive material forming the low-resistivity layer 40 may be used, for example. The thickness of the second low-resisitivity layer 47 may be about 0 to 200 nm, for example.

A method of manufacturing the piezoelectric device 10 according to the first embodiment is described below with reference to FIG. 1.

A (110) oriented silicon substrate is provided as the substrate 1.

The stopper layer 2 is formed over the substrate 1. The stopper layer 2 may be formed by using a thermal oxidation method, a CVD method, or the like.

The hard layer 3 is formed over the stopper layer 2. The hard layer 3 may be formed by using a CVD method, a sputtering method, a deposition method, or the like.

The low-resistivity layer 40 is formed over the hard layer 3. In the first embodiment, the crystal orientation of the conductive material forming the low-resisitivity layer 40 is not particularly limited, as described above. Therefore, the manufacturing conditions and the manufacturing method for the low-resistivity layer 40 may be appropriately selected. For example, the low-resistivity layer 40 may be formed by using a sputtering method, a vacuum deposition method, or the like. The low-resistivity layer 40 may be formed at room temperature to about 600° C., for example.

The buffer layer 41 is formed over the low-resistivity layer 40. The buffer layer 41 may be formed by using a sputtering method, a sol-gel method, a CVD method, a laser ablation method, a molecular beam epitaxy method, or the like. The buffer layer 41 may be formed at about 250 to 300° C., for example.

The conductive oxide layer 42 is formed of lanthanum nickelate over the buffer layer 41. In this case, the amount of oxygen deficiency of lanthanum nickelate can be adjusted by using a target having oxygen deficiency or adjusting the atmosphere during deposition, for example. The conductive oxide layer 42 may be formed by using a sputtering method, a sol-gel method, or the like. The first conductive layer 4 is formed by the above-described steps.

The piezoelectric layer 5 is then formed over the conductive oxide layer 42. The piezoelectric layer 5 may be formed by using a sputtering method, a sol-gel method, or the like.

The second conductive oxide layer 46 is formed over the piezoelectric layer 5. The second conductive oxide layer 46 may be formed by using a sputtering method, a sol-gel method, or the like.

The second low-resistivity layer 47 is formed over the second conductive oxide layer 46. The second low-resistivity layer 47 may be formed by using a sputtering method, a vacuum deposition method, or the like. The second conductive layer 6 is formed by the above-described steps.

The piezoelectric device 10 according to the first embodiment can be manufactured by the above-described steps.

The piezoelectric device 10 according to the first embodiment exhibits excellent piezoelectric characteristics. The reasons therefor are as follows.

The piezoelectric device 10 according to the first embodiment includes the buffer layer 41 formed of the La-layered compound. Since the La-layered compound has a layered structure, the La-layered compound can be easily (001) preferentially oriented independent of the crystal orientation of the conductive material forming the low-resistivity layer 40 as the underlayer. Specifically, (111) or (110) oriented crystals of the La-layered compound are mixed into the buffer layer 41 to only a small extent. Since most crystals of the La-layered compound are (001) oriented, the conductive oxide layer 42 succeeds to the crystal orientation of the buffer layer 41 and is (001) preferentially oriented when forming the conductive oxide layer 42 over the buffer layer 41. Therefore, when forming the piezoelectric layer 5 over the conductive oxide layer 42, the piezoelectric layer 5 succeeds to the crystal orientation of the conductive oxide layer 42 and is (001) preferentially oriented. This enables the piezoelectric device 10 to be provided with the piezoelectric layer 5 having a higher piezoelectric constant and producing a larger amount of deformation upon application of voltage. Specifically, the piezoelectric device 10 according to the first embodiment exhibits excellent piezoelectric characteristics.

As described above, lanthanum nickelate forming the conductive oxide layer 42 tends to exhibit (001) self-orientation. However, when the buffer layer 41 is not formed as the underlayer for the conductive oxide layer 42, (110) oriented crystals of lanthanum nickelate may be mixed into the conductive oxide layer 42 depending on the manufacturing conditions and the manufacturing method for lanthanum nickelate. In the method of manufacturing the piezoelectric device 10 according to the first embodiment, since the conductive oxide layer 42 is formed by using the buffer layer 41 formed of the La-layered compound as the underlayer, lanthanum nickelate more reliably exhibits (001) self-orientation. Therefore, when forming the piezoelectric layer 5 over the conductive oxide layer 42 formed of lanthanum nickelate, a larger number of crystals forming the piezoelectric layer 5 succeed to the crystal orientation of the conductive oxide layer 42 and are (001) oriented.

In the piezoelectric device 10 according to the first embodiment, lanthanum nickelate forming the conductive oxide layer 42 has oxygen deficiency. The lattice constant of lanthanum nickelate forming the conductive oxide layer 42 can be caused to become closer to the lattice constant of a piezoelectric forming the piezoelectric layer 5 by appropriately determining the amount of oxygen deficiency of lanthanum nickelate corresponding to the type of material for the piezoelectric layer 5 formed over the conductive oxide layer 42. Specifically, a lattice mismatch between the piezoelectric layer 5 and the conductive oxide layer 42 can be reduced. As a result, stress applied to the piezoelectric layer 5 can be reduced. This enables the piezoelectric device 10 to be provided with the piezoelectric layer 5 having a high piezoelectric constant and producing a large amount of deformation upon application of voltage. Specifically, the piezoelectric device 10 according to the first embodiment exhibits excellent piezoelectric characteristics.

In the piezoelectric device 10 according to the first embodiment, the first conductive layer 4 includes the low-resistivity layer 40. The low-resistivity layer 40 is formed of a conductive material having a resistivity lower than that of lanthanum nickelate. Therefore, when comparing the case where the first conductive layer 4 does not include the low-resistivity layer 40 with the case where the first conductive layer 4 includes the low-resistivity layer 40 on condition that the first conductive layer 4 has an identical shape, the resistivity of the entire first conductive layer is lower when the first conductive layer 4 includes the low-resistivity layer 40 (i.e. the first embodiment). Therefore, the piezoelectric device 10 according to the first embodiment exhibits excellent piezoelectric characteristics.

Figure 2:
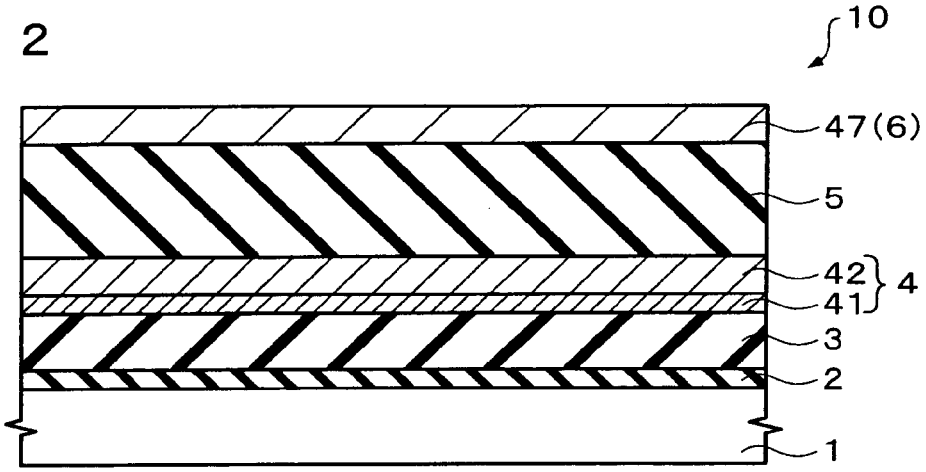
FIG. 2 is a cross-sectional view schematically showing an example of a modification of the piezoelectric device according to the first embodiment.
Figure 3:
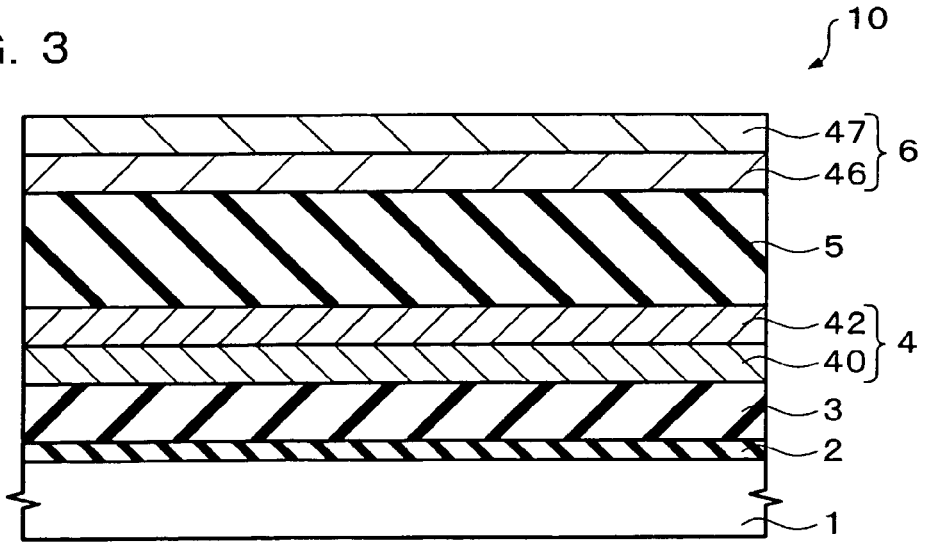
FIG. 3 is a cross-sectional view schematically showing an example of a modification of the piezoelectric device according to the first embodiment.
Figure 4:
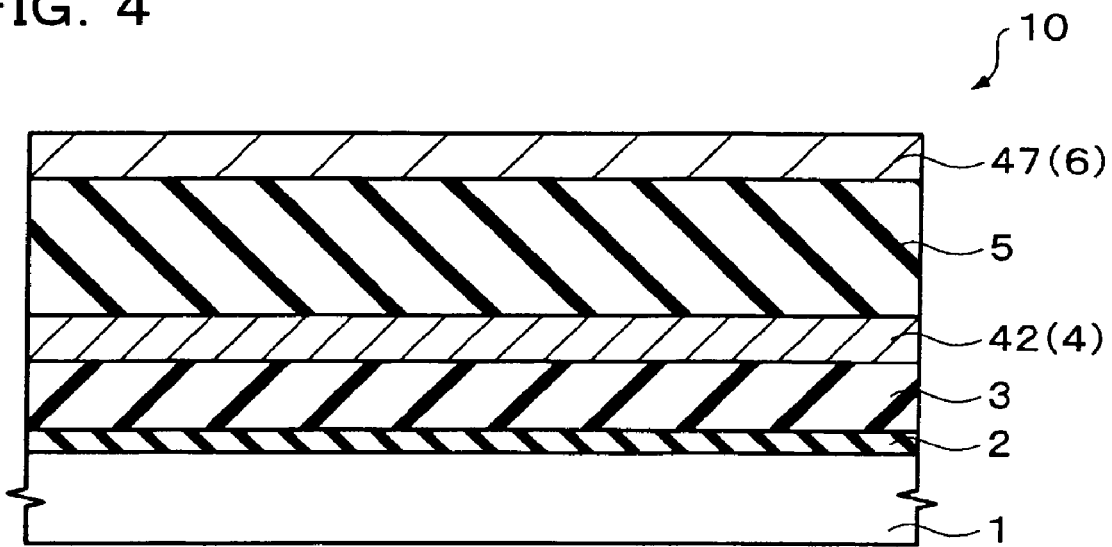
FIG. 4 is a cross-sectional view schematically showing an example of a modification of the piezoelectric device according to the first embodiment.

Modifications of the piezoelectric device 10 according to the first embodiment are described below with reference to the drawings. The following description focuses on the difference between the modification and the above-described piezoelectric device 10 shown in FIG. 1. Description of identical features is omitted. FIGS. 2 to 4 are cross-sectional views schematically showing respective examples of the modifications of the piezoelectric device 10.

As shown in FIG. 2, the first conductive layer 4 may not include the low-resistivity layer 40. Specifically, the first conductive layer 4 may include only the buffer layer 41 and the conductive oxide layer 42.

As shown in FIG. 2, the second conductive layer 6 may include only the second low-resistivity layer 47. Or, the second conductive layer 6 may include only the second conductive oxide layer 46 (not shown). In these cases, the second conductive layer 6 and the first conductive layer 4 become almost symmetrical with respect to the piezoelectric layer 5.

As shown in FIG. 3, the first conductive layer 4 may not include the buffer layer 41. Specifically, the first conductive layer 4 may include only the low-resistivity layer 40 and the conductive oxide layer 42.

As shown in FIG. 4, the first conductive layer 4 may not include the low-resistivity layer 40 and the buffer layer 41. Specifically, the first conductive layer 4 may include only the conductive oxide layer 42.

Figure 5:
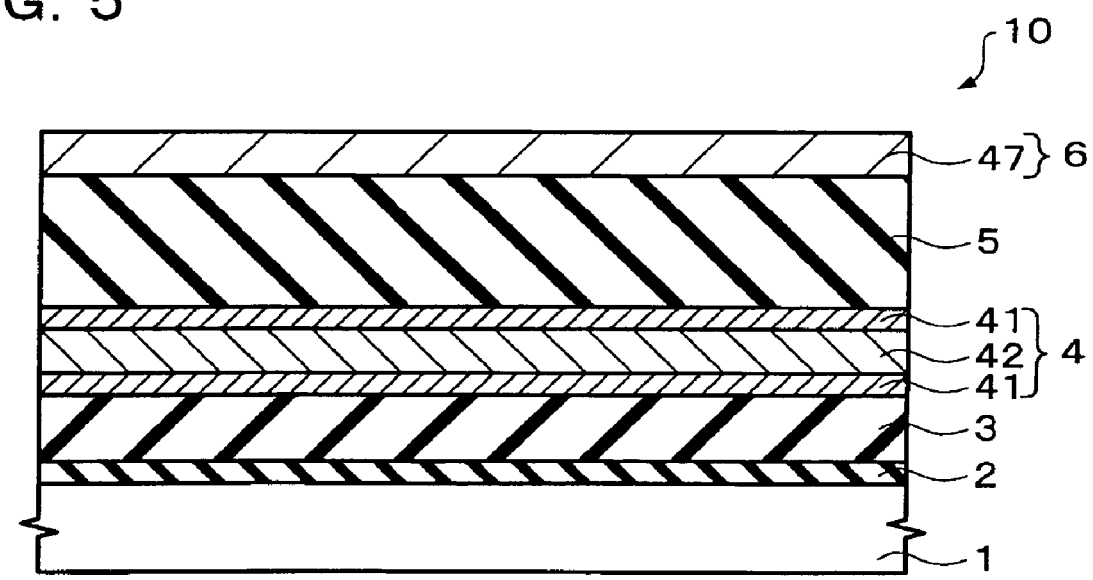
FIG. 5 is a cross-sectional view schematically showing an example of a modification of the piezoelectric device according to the first embodiment.

As shown in FIG. 5, the first conductive layer 4 may include two buffer layers 41 and the conductive oxide layer 42 positioned between the buffer layers 41.

The above-described modifications are merely examples, and the invention is not limited to the above-described modifications. For example, the order of layers, the number of layers, and the like may be appropriately changed.

SECOND EMBODIMENT

Figure 6:
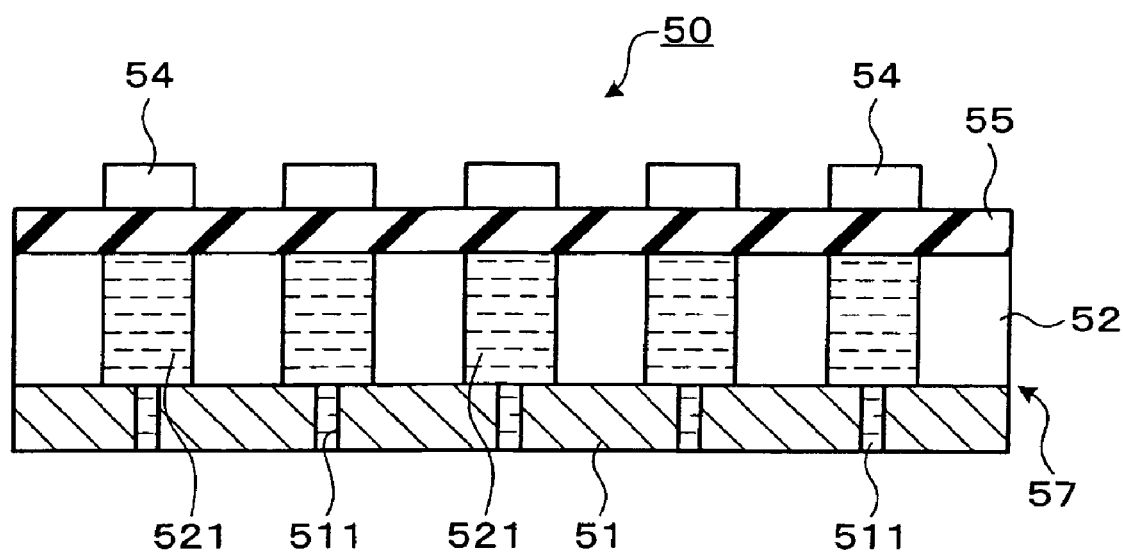
FIG. 6 is a schematic configuration diagram of an inkjet recording head according to a second embodiment of the invention.
Figure 7:
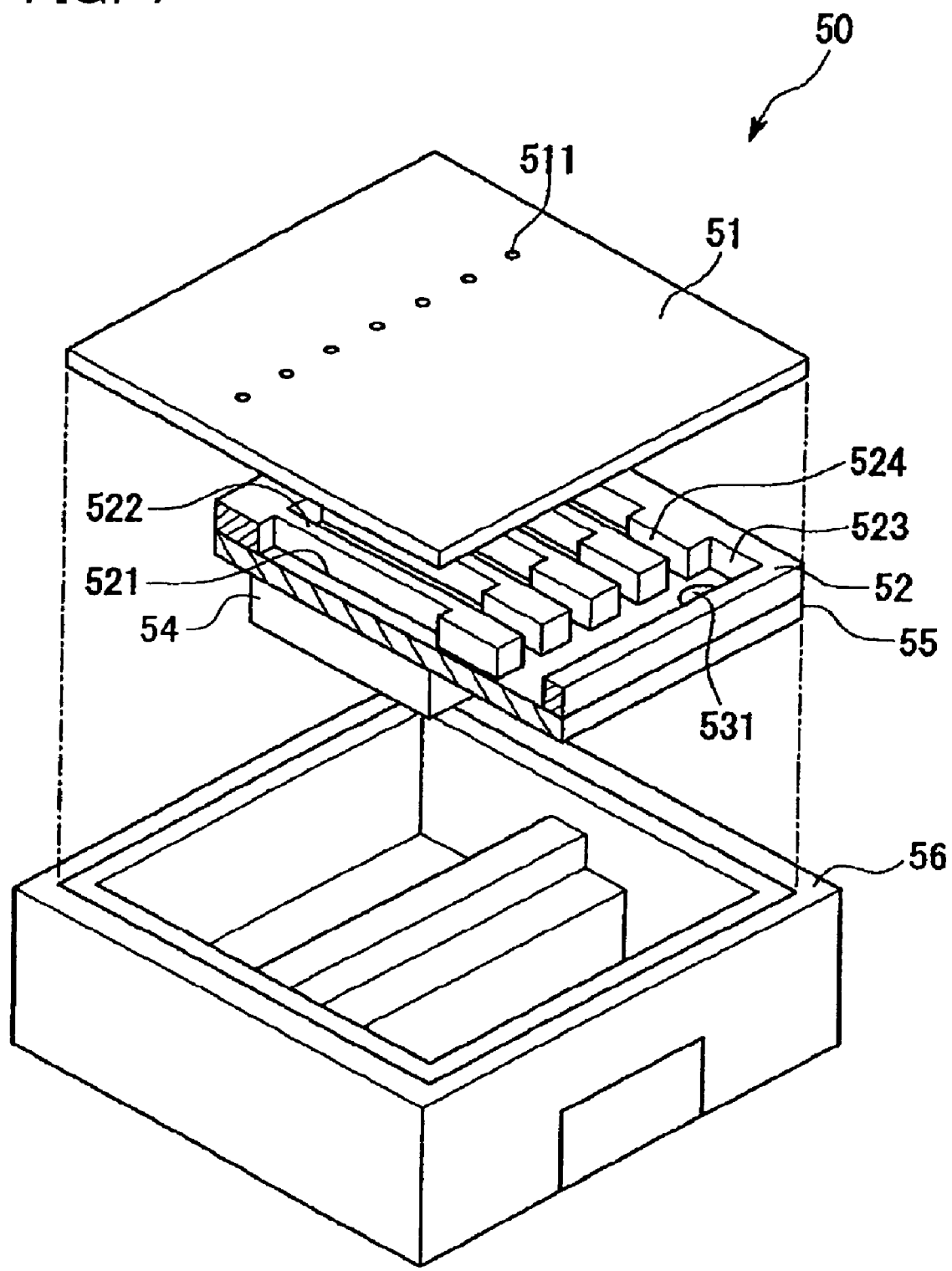
FIG. 7 is an exploded perspective view of an inkjet recording head according to the second embodiment.

One embodiment of an inkjet recording head including the piezoelectric device 10 according to the first embodiment is described below. FIG. 6 is a side cross-sectional view showing a schematic configuration of an inkjet recording head according to a second embodiment, and FIG. 7 is an exploded perspective view of the inkjet recording head. FIG. 7 shows a state in which the inkjet recording head is reversed in the vertical direction.

As shown in FIG. 6, the inkjet recording head (hereinafter may be called "head") 50 includes a head body 57 and piezoelectric sections 54 formed over the head body 57. The piezoelectric section 54 shown in FIG. 6 corresponds to the first conductive layer 4, the piezoelectric layer 5, and the second conductive layer 6 of the piezoelectric device 10 shown in FIG. 1. In the inkjet recording head according to the second embodiment, the piezoelectric section 54 may function as a piezoelectric actuator. The piezoelectric actuator is a device having the function of moving an object.

The stopper layer 2 and the hard layer 3 of the piezoelectric device 10 shown in FIG. 1 correspond to the elastic layer 55 shown in FIG. 6. The substrate 1 (see FIG. 1) forms the major portion of the head body 57.

As shown in FIG. 7, the head 50 includes a nozzle plate 51, an ink chamber substrate 52, the elastic layer 55, and the piezoelectric section (vibration source) 54 bonded to the elastic layer 55. These components are accommodated in a base 56. The head 50 forms an on-demand type piezoelectric jet head.

The nozzle plate 51 is formed of a stainless steel rolled plate or the like, in which a number of nozzles 511 for ejecting ink droplets are formed in a row. The pitch between the nozzles 511 is appropriately determined depending on the printing precision.

The ink chamber substrate 52 is attached to (secured on) the nozzle plate 51. The ink chamber substrate 52 is formed by the substrate 1 (see FIG. 1). In the ink chamber substrate 52, cavities (ink cavities) 521, a reservoir 523, and supply ports 524 are partitioned by the nozzle plate 51, side walls (partition walls) 522, and the elastic layer 55. The reservoir 523 temporarily stores ink supplied from an ink cartridge 631 (see FIG. 10). Ink is supplied to the cavities 521 from the reservoir 523 through the supply ports 524.

As shown in FIGS. 6 and 7, the cavities 521 are disposed corresponding to the nozzles 511. The volume of each cavity 521 can be changed by vibration of the elastic layer 55. The cavity 521 is configured to eject ink as a result of a change in volume.

A (110) oriented single-crystal silicon substrate is used as the base material for forming the ink chamber substrate 52 (i.e. substrate 1 (see FIG. 1)). Since the (110) oriented single-crystal silicon substrate is suitable for anisotropic etching, the ink chamber substrate 52 can be easily and reliably formed.

The elastic layer 55 is disposed on the side of the ink chamber substrate 52 opposite to the nozzle plate 51. The piezoelectric sections 54 are disposed on the side of the elastic layer 55 opposite to the ink chamber substrate 52. As shown in FIG. 7, a communication hole 531 is formed through the elastic layer 55 in the thickness direction at a specific position of the elastic layer 55. Ink is supplied to the reservoir 523 from the ink cartridge 631 through the communication hole 531.

The piezoelectric section 54 is electrically connected with a piezoelectric device driver circuit described later, and is actuated (vibrates or is deformed) based on a signal from the piezoelectric device driver circuit. Specifically, the piezoelectric section 54 functions as a vibration source (head actuator). The elastic layer 55 vibrates (deflects) due to vibration (deflection) of the piezoelectric section 54, and functions to momentarily increase the pressure inside the cavity 521.

The base 56 is formed of a resin material, a metal material, or the like. As shown in FIG. 7, the ink chamber substrate 52 is secured on and supported by the base 56.

Figure 8:
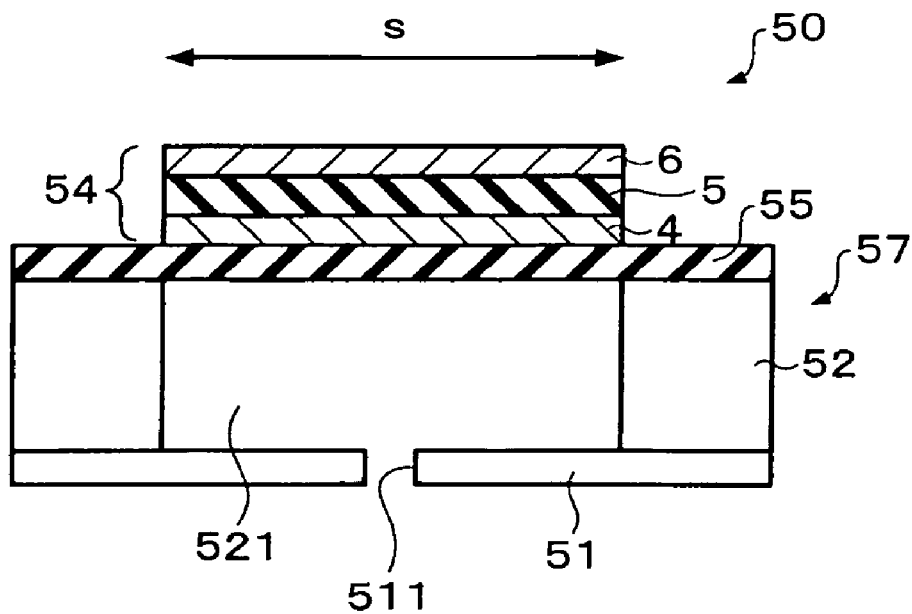
FIG. 8 is illustrative of the operation of the inkjet recording head.

The operation of the inkjet recording head 50 according to the second embodiment is described below. In the head 50 according to the second embodiment, when a specific ejection signal is not input through the piezoelectric device driver circuit, that is, when voltage is not applied between the first conductive layer 4 and the second conductive layer 6 of the piezoelectric section 54, the piezoelectric layer 5 is not deformed as shown in FIG. 8. Therefore, since the elastic layer 55 is not deformed, a change in the volume of the cavity 521 does not occur. Therefore, an ink droplet is not ejected from the nozzle 511.

Figure 9:
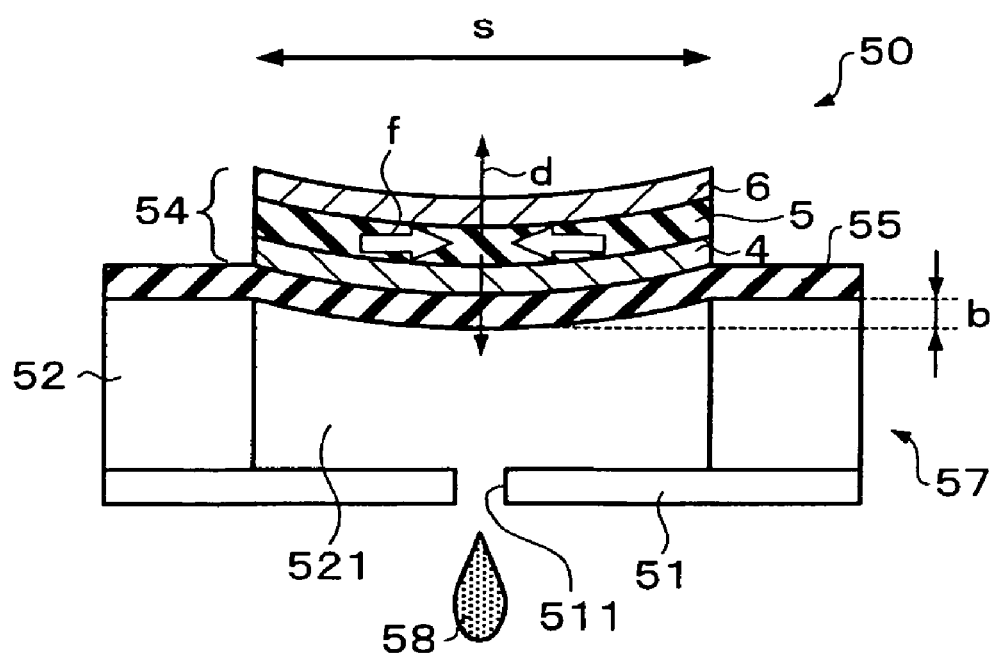
FIG. 9 is illustrative of the operation of the inkjet recording head.

On the other hand, when a specific ejection signal is input through the piezoelectric device driver circuit, that is, when voltage is applied between the first conductive layer 4 and the second conductive layer 6 of the piezoelectric section 54, flexural deformation of the piezoelectric layer 5 occurs along the width direction (direction indicated by the arrow "s" in FIG. 9), as shown in FIG. 9. As a result, the elastic layer 55 is deformed, so that the volume of the cavity 521 is changed. In this case, the pressure inside the cavity 521 is momentarily increased, so that an ink droplet 58 is ejected from the nozzle 511.

Specifically, when voltage is applied to the piezoelectric layer 5, the crystal lattice of the piezoelectric layer 5 is stretched in the direction perpendicular to the plane direction (direction indicated by the arrow "d" in FIG. 9), but is compressed in the plane direction. In this state, a tensile stress f is applied to the piezoelectric layer 5. Therefore, the elastic layer 55 is warped and deformed by the tensile stress f. The larger the amount of displacement (absolute value) of the piezoelectric layer 5 in the vertical direction of the cavity 521, the larger the amount of deformation of the elastic layer 55, so that an ink droplet can be ejected more efficiently.

When ejection of ink has been completed, the piezoelectric device driver circuit stops applying voltage between the first conductive layer 4 and the second conductive layer 6. As a result, the piezoelectric section 54 recovers the original shape shown in FIG. 8, so that the volume of the cavity 521 is increased. In this case, pressure is applied to the ink in the direction from the ink cartridge 631 toward the nozzle 511 (pressure in the forward direction). Therefore, air does not enter the cavity 521 from the nozzle 511, and ink in an amount corresponding to the amount of ink which has been ejected is supplied to the cavity 521 from the ink cartridge 631 through the reservoir 523.

An arbitrary (desired) character, figure, or the like can be printed by sequentially inputting an ejection signal to the piezoelectric section 54, provided at a position at which it is desired to eject an ink droplet, through the piezoelectric device driver circuit.

An example of a method of manufacturing the inkjet recording head 50 according to the second embodiment is described below.

The base material for the ink chamber substrate 52, that is, the substrate 1 formed of a (110) oriented silicon substrate is provided. As shown in FIG. 1, the stopper layer 2, the hard layer 3, the first conductive layer 4, the piezoelectric layer 5, and the second conductive layer 6 are sequentially formed over the substrate 1.

As shown in FIGS. 8 and 9, the second conductive layer 6, the piezoelectric layer 5, and the first conductive layer 4 are patterned corresponding to the respective cavities 521 to form the piezoelectric sections 54 in a number corresponding to the number of cavities 521, as shown in FIG. 6.

Then, the base material (substrate 1) for the ink chamber substrate 52 is patterned so that recesses forming the cavities 521 are formed at positions corresponding to the piezoelectric sections 54, and recesses forming the reservoir 523 and the supply ports 524 are formed at specific positions.

In the second embodiment, since the (110) oriented single-crystal silicon substrate is used as the base material (substrate 1), wet etching (anisotropic etching) using a high-concentration alkaline aqueous solution is suitably used. When wet etching the base material using a high-concentration alkaline aqueous solution, the stopper layer 2 may be caused to function as the etching stopper, as described above. Therefore, the ink chamber substrate 52 can be more easily formed.

The ink chamber substrate 52 is formed by removing the base material (substrate 1) by etching in the thickness direction until the elastic layer 55 is exposed. A portion remaining after etching forms the sidewall 522.

Then, the nozzle plate 51 in which the nozzles 511 are formed is positioned so that each nozzle 511 is positioned corresponding to the recess forming each cavity 521, and bonded to the ink chamber substrate 52. As a result, the cavities 521, the reservoir 523, and the supply ports 524 are formed. The nozzle plate 51 may be bonded by using an adhesive bonding method, a welding method, or the like. Then, the ink chamber substrate 52 is attached to the base 56.

The inkjet recording head 50 according to the second embodiment can be manufactured by the above-described steps.

In the inkjet recording head 50 according to the second embodiment, the piezoelectric layer 5 of the piezoelectric section 54 has a high piezoelectric constant ($d_{31}$) and produces a large amount of deformation upon application of voltage, as described above. Specifically, the piezoelectric section 54 exhibits excellent piezoelectric characteristics. This increases the amount of deformation of the elastic layer 55, so that an ink droplet can be more efficiently ejected. The term "efficiently" used herein means that a certain amount of ink droplet can be ejected at a lower voltage. This means that the driver circuit can be simplified and power consumption can be reduced, whereby the nozzles 511 can be formed at a higher density, for example. This enables high-density printing and high-speed printing. Moreover, since the length of the cavity 521 can be reduced, the size of the entire head can be reduced.

THIRD EMBODIMENT

Figure 10:
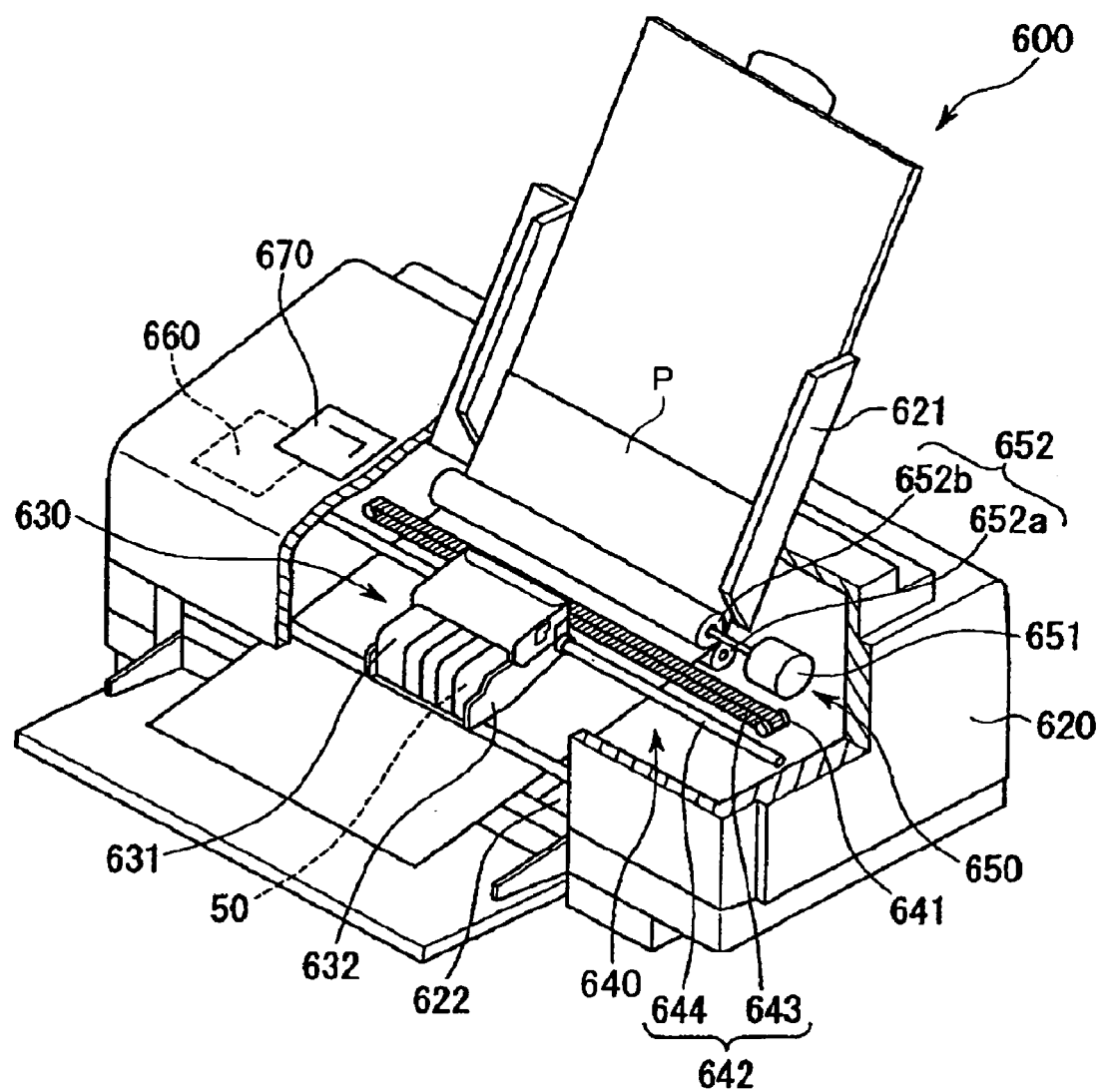
FIG. 10 is a schematic configuration diagram of an inkjet printer according to a third embodiment of the invention.

One embodiment of an inkjet printer including the inkjet recording head 50 according to the second embodiment is described below. FIG. 10 is a schematic configuration diagram showing an inkjet printer 600 according to a third embodiment. The inkjet printer 600 functions as a printer which can print an image on paper or the like. In the following description, the term "upper" refers to the upper side of FIG. 10, and the term "lower" refers to the lower side of FIG. 10.

The inkjet printer 600 includes a device body 620, a tray 621 which is provided at the upper rear of the inkjet printer 600 and in which recording paper P is placed, a discharge port 622 which is provided at the lower front of the inkjet printer 600 and which discharges the recording paper P, and an operation panel 670 provided at the upper surface of the inkjet printer 600.

The device body 620 includes a printing device 640 having a head unit 630 which mainly performs a reciprocating operation, a paper feed device 650 which feeds the recording paper P to the printing device 640 one at a time, and a control section 660 which controls the printing device 640 and the paper feed device 650.

The printing device 640 includes the head unit 630, a carriage motor 641 functioning as a driving source for the head unit 630, and a reciprocation mechanism 642 which reciprocates the head unit 630 upon receiving rotation of the carriage motor 641.

The head unit 630 includes the inkjet recording head 50 having a number of nozzles 511 at the bottom, an ink cartridge 631 which supplies ink to the inkjet recording head 50, and a carriage 632 carrying the inkjet recording head 50 and the ink cartridge 631.

The reciprocation mechanism 642 includes a carriage guide shaft 643 of which the ends are supported by a frame (not shown), and a timing belt 644 extending in parallel to the carriage guide shaft 643. The carriage 632 is reciprocally supported by the carriage guide shaft 643 and is secured on a part of the timing belt 644. When the timing belt 644 moves normally and reversely through pulleys by the operation of the carriage motor 641, the head unit 630 reciprocates along the carriage guide shaft 643. Ink is appropriately ejected from the inkjet recording head 50 during reciprocation of the head unit 630, so that an image is printed on the recording paper P.

The paper feed device 650 includes a paper feed motor 651 functioning as a driving source, and a paper feed roller 652 which rotates by the operation of the paper feed motor 651. The paper feed roller 652 includes a driven roller 652a and a drive roller 652b positioned opposite to each other with a feed path for the recording paper P (recording paper P) interposed therebetween. The drive roller 652b is connected with the paper feed motor 651.

Since the inkjet printer 600 according to the third embodiment includes the high-performance inkjet recording head 50 in which the nozzles can be formed at a high density as described above, high-density printing and high-speed printing can be achieved.

The inkjet printer 600 according to the invention may also be used as a liquid droplet ejection device for industrial use. In this case, various functional materials adjusted to appropriate viscosity by using a solvent or dispersion medium may be used as ink (liquid material) to be ejected.

FOURTH EMBODIMENT

Figure 11:
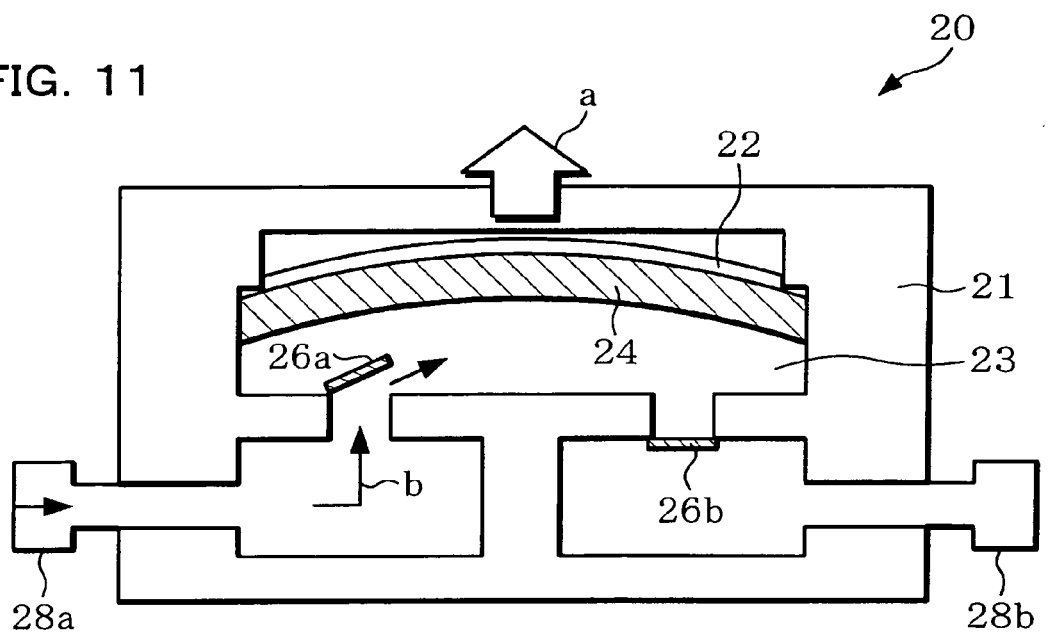
FIG. 11 is a schematic cross-sectional view of a piezoelectric pump according to a fourth embodiment of the invention.
Figure 12:
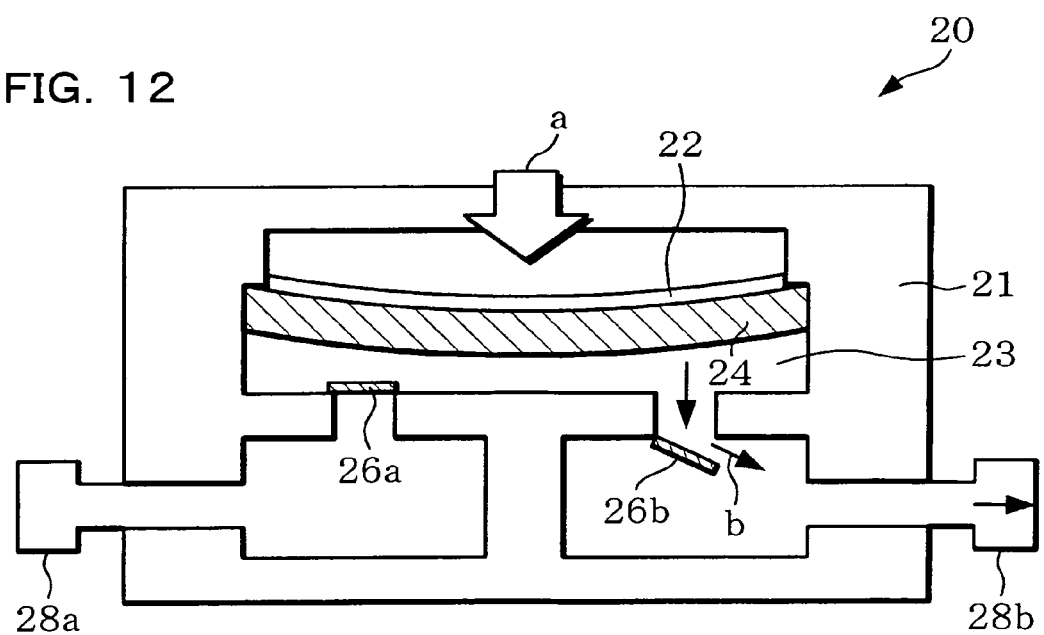
FIG. 12 is a schematic cross-sectional view of a piezoelectric pump according to the fourth embodiment.

One embodiment of a piezoelectric pump including the piezoelectric device 10 according to the first embodiment is described below with reference to the drawings. FIGS. 11 and 12 are schematic cross-sectional views of a piezoelectric pump 20 according to a fourth embodiment. In the piezoelectric pump 20 according to the fourth embodiment, the piezoelectric device may function as a piezoelectric actuator. A piezoelectric section 22 shown in FIGS. 11 and 12 includes the first conductive layer 4, the piezoelectric layer 5, and the second conductive layer 6 of the piezoelectric device 10 shown in FIG. 1. The stopper layer 2 and the hard layer 3 of the piezoelectric device 10 shown in FIG. 1 make up a diaphragm 24 in FIGS. 11 and 12. The substrate 1 (see FIG. 1) forms a base 21 forming the major portion of the piezoelectric pump 20. The piezoelectric pump 20 includes the base 21, the piezoelectric section 22, a pump chamber 23, the diaphragm 24, an inlet-side check valve 26a, an outlet-side check valve 26b, an inlet port 28a, and an outlet port 28b.

The operation of the piezoelectric pump is described below.

When voltage is supplied to the piezoelectric section 22, voltage is applied to the piezoelectric layer 5 (see FIG. 1) in the thickness direction. As shown in FIG. 11, the piezoelectric section 22 is deformed (deflected) in the direction in which the volume of the pump chamber 23 is increased (direction indicated by the arrow "a" shown in FIG. 11). The diaphragm 24 is also deformed together with the piezoelectric section 22 in the direction in which the volume of the pump chamber 23 is increased. Therefore, the pressure inside the pump chamber 23 changes so that fluid flows into the pump chamber 23 through the inlet port 28a (in the direction indicated by the arrow "b" shown in FIG. 11) by the action of the check valves 26a and 26b.

When supply of the voltage to the piezoelectric section 22 is stopped, the application of the voltage to the piezoelectric film 5 (see FIG. 1) in the thickness direction is stopped. As a result, as shown in FIG. 12, the piezoelectric section 22 is deformed in the direction in which the volume of the pump chamber 23 is decreased (direction indicated by the arrow "a" shown in FIG. 12). The diaphragm 24 is also deformed together with the piezoelectric section 22 in the direction in which the volume of the pump chamber 23 is decreased. Therefore, the pressure inside the pump chamber 23 changes so that fluid is ejected to the outside through the outlet port 28b (in the direction indicated by the arrow "b" shown in FIG. 12) by the action of the check valves 26a and 26b.

The piezoelectric pump 20 may be used as a water-cooling module for an electronic instrument such as a personal computer, preferably a notebook type personal computer. A water-cooling module utilizes the above-described piezoelectric pump 20 for driving a cooling liquid, and is configured to include the piezoelectric pump 20, a circulating water channel, and the like.

According to the piezoelectric pump 20 according to the fourth embodiment, since the piezoelectric layer 5 of the piezoelectric section 22 exhibits excellent piezoelectric characteristics as described above, introduction and ejection of fluid can be efficiently performed. Therefore, the piezoelectric pump 20 according to the fourth embodiment can produce a high ejection pressure and a large amount of ejection. Moreover, the piezoelectric pump 20 can be operated at high speed. Furthermore, the size of the entire piezoelectric pump 20 can be reduced.

FIFTH EMBODIMENT

Figure 13:
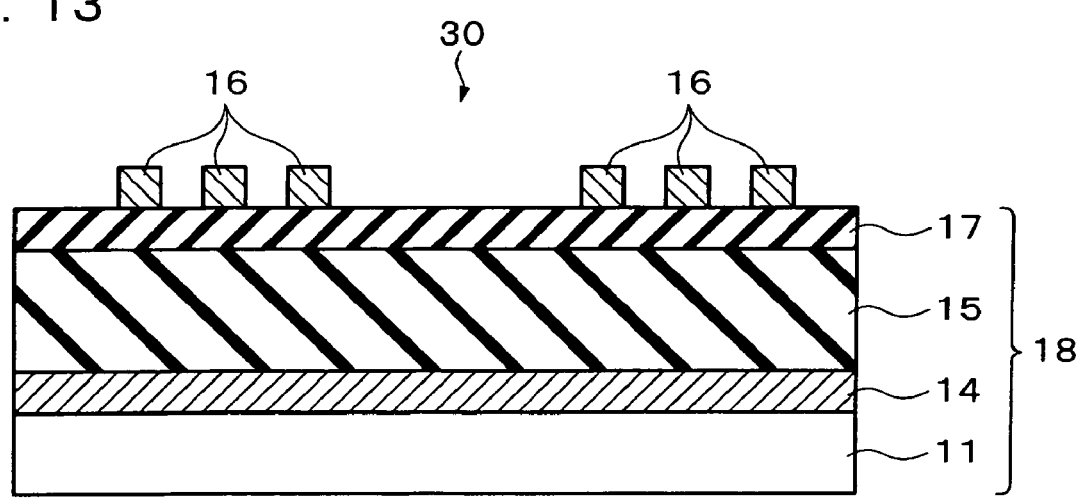
FIG. 13 is a side cross-sectional view showing a surface acoustic wave device according to a fifth embodiment of the invention.

An example of a surface acoustic wave device according to a fifth embodiment of the invention is described below with reference to the drawings. As shown in FIG. 13, a surface acoustic wave device 30 as an example of the fifth embodiment includes a substrate 11, a first conductive layer 14, a piezoelectric layer 15, a protective layer 17, and a second conductive layer 16. The substrate 11, the first conductive layer 14, the piezoelectric layer 15, and the protective layer 17 make up a base 18.

As the substrate 11, a (100) oriented single-crystal silicon substrate or the like may be used. The first conductive layer 14 may be the first conductive layer 4 of the piezoelectric device 10 shown in FIG. 1. The piezoelectric layer 15 may be the piezoelectric layer 5 of the piezoelectric device 10 shown in FIG. 1. The protective layer 17 may be formed of an oxide, nitride, or the like. The protective layer 17 also functions as a temperature compensation layer. The second conductive layer 16 may be the second conductive layer 6 of the piezoelectric device 10 shown in FIG. 1. The second conductive layer 16 is an inter-digital transducer type electrode (hereinafter called "IDT electrode"). The second conductive layer 16 has a pattern of IDT electrodes 141, 142, 151, 152, and 153 shown in FIGS. 14 and 15 when viewed from the upper side, for example. A protective layer may be formed over the IDT electrodes.

According to the surface acoustic wave device 30 according to the fifth embodiment, since the piezoelectric layer 15 formed by the piezoelectric layer 5 of the piezoelectric device 1 shown in FIG. 1 exhibits excellent piezoelectric properties, the performance of the surface acoustic wave device 30 is increased.

SIXTH EMBODIMENT

Figure 14:
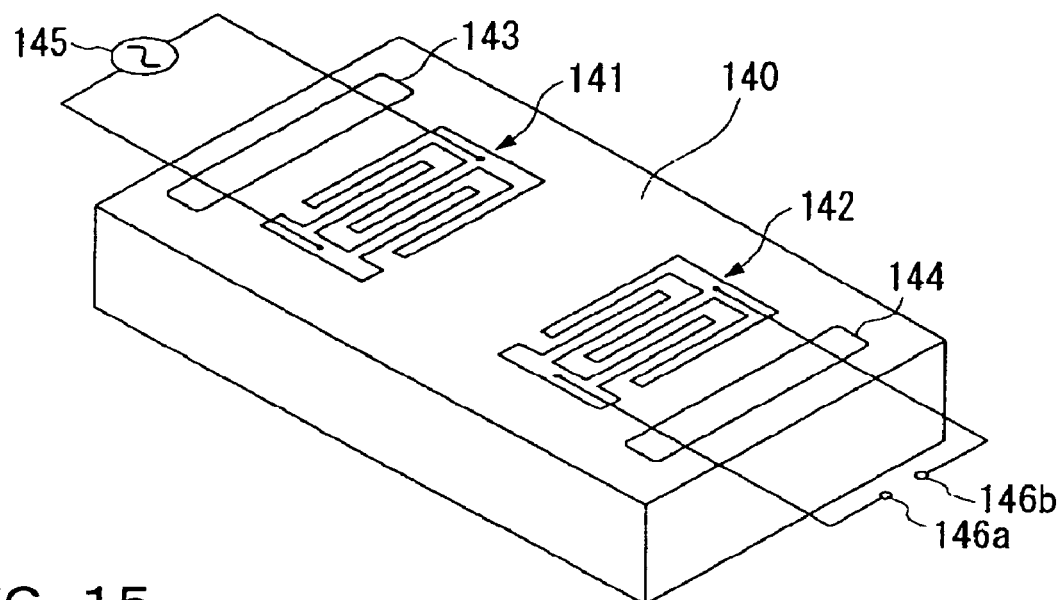
FIG. 14 is a perspective view showing a frequency filter according to a sixth embodiment of the invention.

An example of a frequency filter according to a sixth embodiment of the invention is described below with reference to the drawings. FIG. 14 is a view schematically showing a frequency filter as an example of the sixth embodiment.

As shown in FIG. 14, the frequency filter includes a base 140. As the base 140, the base 18 of the surface acoustic wave device 30 shown in FIG. 13 may be used.

The IDT electrodes 141 and 142 are formed on the upper side of the base 140. Sound absorbing sections 143 and 144 are formed on the upper side of the base 140 so that the IDT electrodes 141 and 142 are positioned between the sound absorbing sections 143 and 144. The sound absorbing sections 143 and 144 absorb surface acoustic waves propagated on the surface of the base 140. A high-frequency signal source 145 is connected with the IDT electrode 141 formed on the base 140, and signal lines are connected with the IDT electrode 142.

The operation of the frequency filter is described below.

In the above-described configuration, when a high-frequency signal is output from the high-frequency signal source 145, the high-frequency signal is applied to the IDT electrode 141 so that surface acoustic waves occur on the upper side of the base 140. The surface acoustic waves propagated from the IDT electrode 141 toward the sound absorbing section 143 are absorbed by the sound absorbing section 143. However, the surface acoustic waves propagated toward the sound absorbing section 142 and having a specific frequency determined according to the pitch of the IDT electrode 142 or the like or having a frequency in a specific band are converted into electric signals, and removed at terminals 146a and 146b through the signal lines. Most of the frequency components other than a specific frequency or a frequency in a specific band are absorbed by the sound absorbing section 144 through the IDT electrode 142. Thus, it is possible to obtain (filter) only surface acoustic waves having a specific frequency or a frequency in a specific band from electric signals supplied to the IDT electrode 141 of the frequency filter according to the sixth embodiment.

SEVENTH EMBODIMENT

Figure 15:
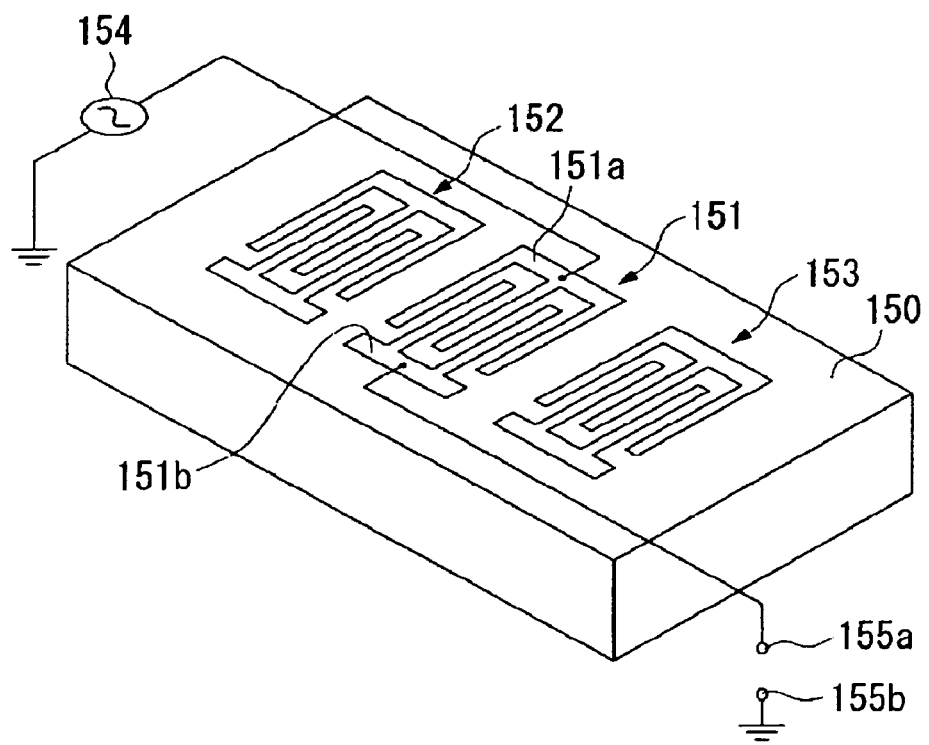
FIG. 15 is a perspective view showing an oscillator according to a seventh embodiment of the invention.

An example of an oscillator according to a seventh embodiment of the invention is described below with reference to the drawings. FIG. 15 is a view schematically showing the oscillator as an example of the seventh embodiment.

As shown in FIG. 15, the oscillator includes a base 150. As the base 150, the base 18 of the surface acoustic wave device 30 shown in FIG. 13 may be used in the same manner as the above-described frequency filter.

The IDT electrode 151 is formed on the upper side of the base 150, and the IDT electrodes 152 and 153 are formed so that the IDT electrode 151 is positioned between the IDT electrodes 152 and 153. A high-frequency signal source 154 is connected with a comb-shaped electrode 151a forming the IDT electrode 151, and a signal line is connected with the other comb-shaped electrode 151b. The IDT electrode 151 corresponds to an electrode for applying an electric signal, and the IDT electrodes 152 and 153 correspond to electrodes for causing a specific frequency component or a frequency component in a specific band of surface elastic waves generated by the IDT electrode 151 to resonate.

The operation of the oscillator is described below.

In the above-described configuration, when a high-frequency signal is output from the high-frequency signal source 154, the high-frequency signal is applied to the comb-shaped electrode 151a of the IDT electrode 151, so that surface acoustic waves propagated toward the IDT electrode 152 and surface acoustic waves propagated toward the IDT electrode 153 are generated on the upper side of the base 150. The surface acoustic waves having a specific frequency component are reflected by the IDT electrodes 152 and 153 so that stationary waves occur between the IDT electrodes 152 and 153. The surface acoustic waves having a specific frequency component are repeatedly reflected by the IDT electrodes 152 and 153 so that a specific frequency component or a frequency component in a specific band resonates to increase the amplitude. A part of the surface acoustic waves having a specific frequency component or a frequency component in a specific band is removed through the comb-shaped electrode 151b of the IDT electrode 151, so that electric signals having a frequency corresponding to the resonant frequency of the IDT electrodes 152 and 153 (or frequency having a certain band) can be removed at terminals 155a and 155b.

Figure 16:
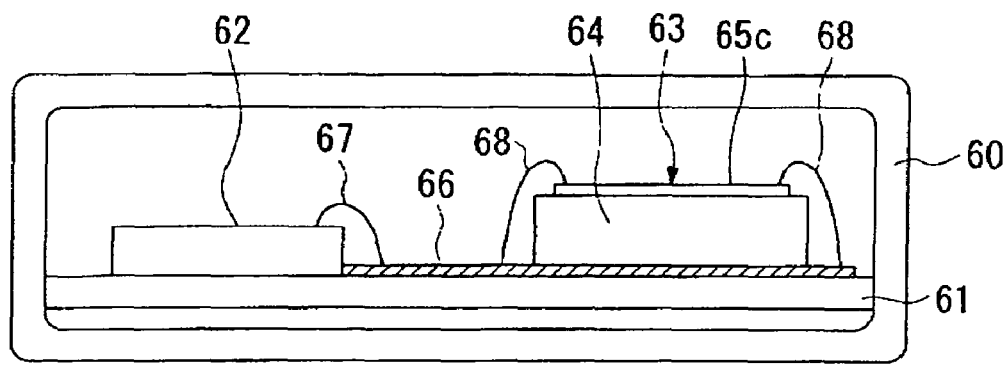
FIG. 16 is a schematic view showing an example in which the oscillator according to the seventh embodiment is applied to a VCSO.
Figure 17:
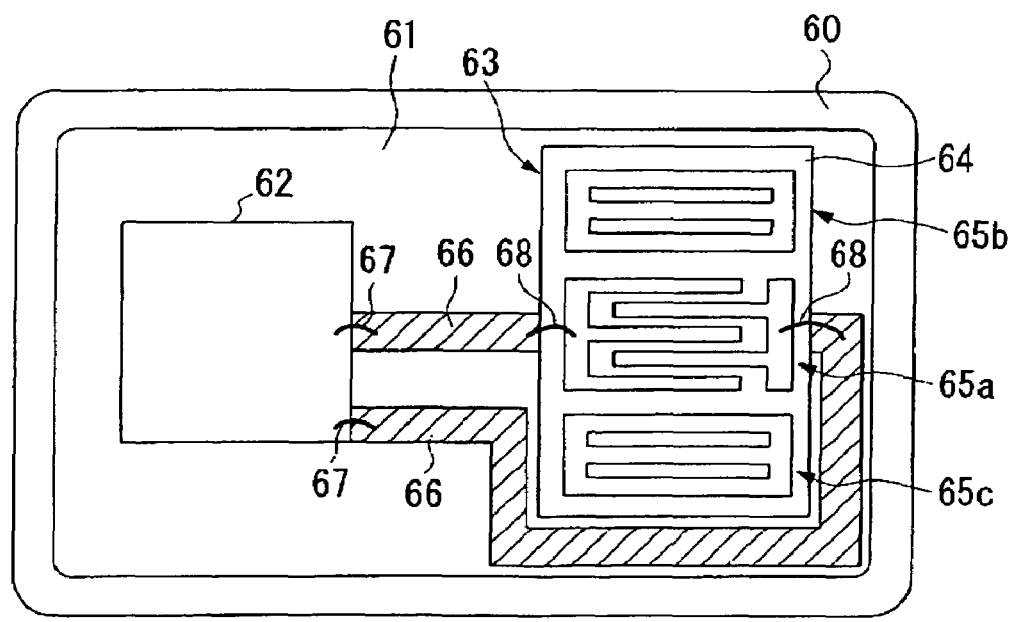
FIG. 17 is a schematic view showing an example in which the oscillator according to the seventh embodiment is applied to a VCSO.

FIGS. 16 and 17 are views schematically showing an example in which the above-described oscillator is applied to a voltage controlled saw oscillator (VCSO). FIG. 16 is a side perspective view, and FIG. 17 is a top perspective view.

The VCSO is provided in a housing 60 made of a metal (aluminum or stainless steel). An integrated circuit (IC) 62 and an oscillator 63 are provided on a substrate 61. In this case, the IC 62 is an oscillating circuit which controls the frequency applied to the oscillator 63 corresponding to the voltage value input from an external circuit (not shown).

In the oscillator 63, IDT electrodes 65a to 65c are formed on a base 64. The configuration of the oscillator 63 is almost the same as the configuration of the oscillator shown in FIG. 15. As the base 64, the base 18 of the surface acoustic wave device 30 shown in FIG. 13 may be used in the same manner as the oscillator shown in FIG. 15.

An interconnect 66 for electrically connecting the IC 62 with the oscillator 63 is pattered on the substrate 61. The IC 62 and the interconnect 66 are connected through a wire 67 such as a gold wire, and the oscillator 63 and the interconnect 66 are connected through a wire 68 such as a gold wire. This allows the IC 62 and the oscillator 63 to be electrically connected through the interconnect 66.

Figure 18:
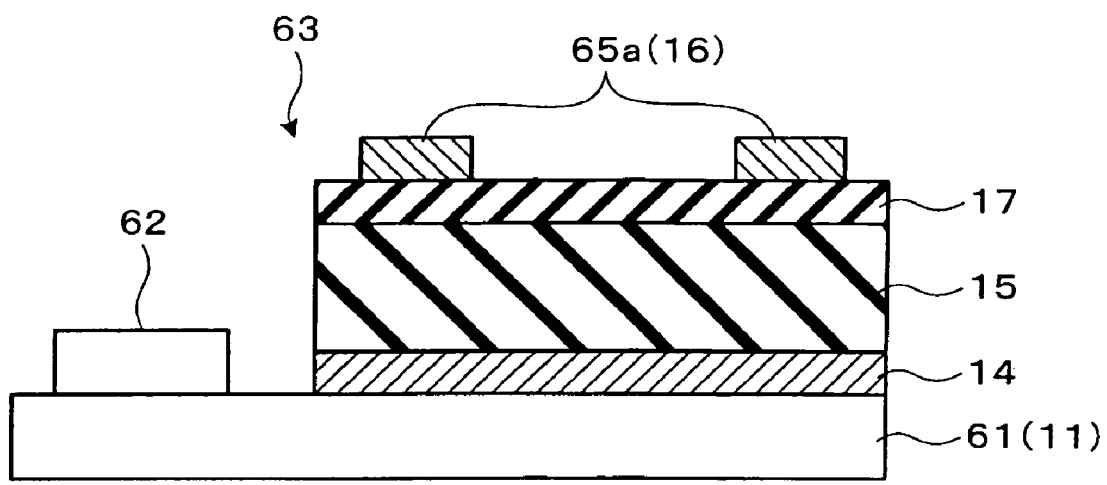
FIG. 18 is a schematic view showing an example in which the oscillator according to the seventh embodiment is applied to a VCSO.

The VCSO may be formed by integrating the IC 62 and the oscillator 63 on a single substrate. FIG. 18 is a schematic view of a VCSO formed by integrating the IC 62 and the oscillator 63 on the substrate 61.

As shown in FIG. 18, the VCSO is formed so that the substrate 61 is used in common for the IC 62 and the oscillator 63. As the substrate 61, the substrate 11 of the surface acoustic wave device 30 shown in FIG. 13 may be used. The IC 62 is electrically connected with the electrode 65a of the oscillator 63 (not shown). As the electrode 65a, the second electrode 16 of the surface acoustic wave device 30 shown in FIG. 13 may be used. As a transistor making up the IC 62, a thin-film transistor (TFT) may be used.

Figure 19:
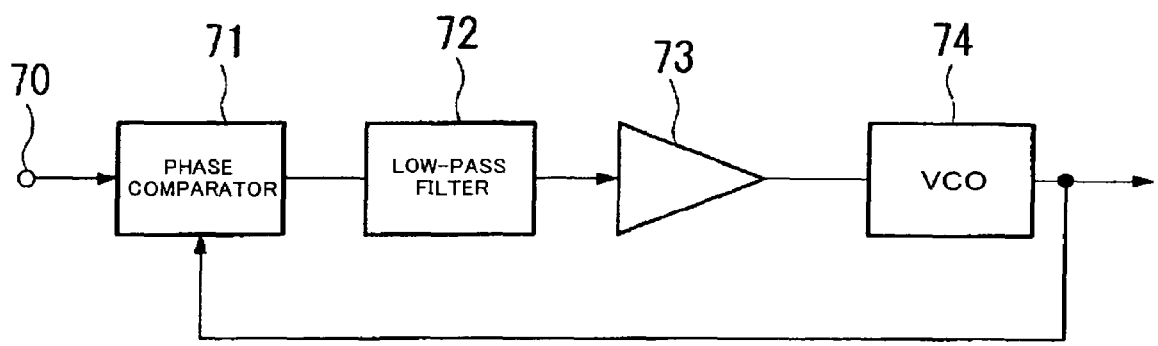
FIG. 19 is a block diagram showing a basic configuration of a PLL circuit.

The VCSO shown in FIGS. 16 to 18 is used as a voltage controlled oscillator (VCO) of a PLL circuit shown in FIG. 19, for example. The PLL circuit is briefly described below.

FIG. 19 is a block diagram showing a basic configuration of the PLL circuit. The PLL circuit includes a phase comparator 71, a low-pass filter 72, an amplifier 73, and a VCO 74. The phase comparator 71 compares the phase (or frequency) of a signal input through an input terminal 70 with the phase (or frequency) of a signal output from the VCO 74, and generates an error voltage signal of which the value is set corresponding to the difference determined by comparison. The low-pass filter 72 allows only a low-frequency component at a position of the error voltage signal output from the phase comparator 71 to pass therethrough. The amplifier 73 amplifies the signal output from the low-pass filter 72. The VCO 74 is an oscillating circuit of which the oscillation frequency continuously changes within a certain range corresponding to the input voltage value.

The PLL circuit having such a configuration operates so that the difference between the phase (or frequency) of the signal input through the input terminal 70 and the phase (or frequency) of the signal output from the VCO 74 is decreased, and synchronizes the frequency of the signal output from the VCO 74 with the frequency of the signal input through the input terminal 70. When the frequency of the signal output from the VCO 74 has been synchronized with the frequency of the signal input through the input terminal 70, the PLL circuit then outputs a signal which coincides with the signal input through the input terminal 70 excluding a constant phase difference and follows a change in the input signal.

EIGHTH EMBODIMENT

Figure 20:
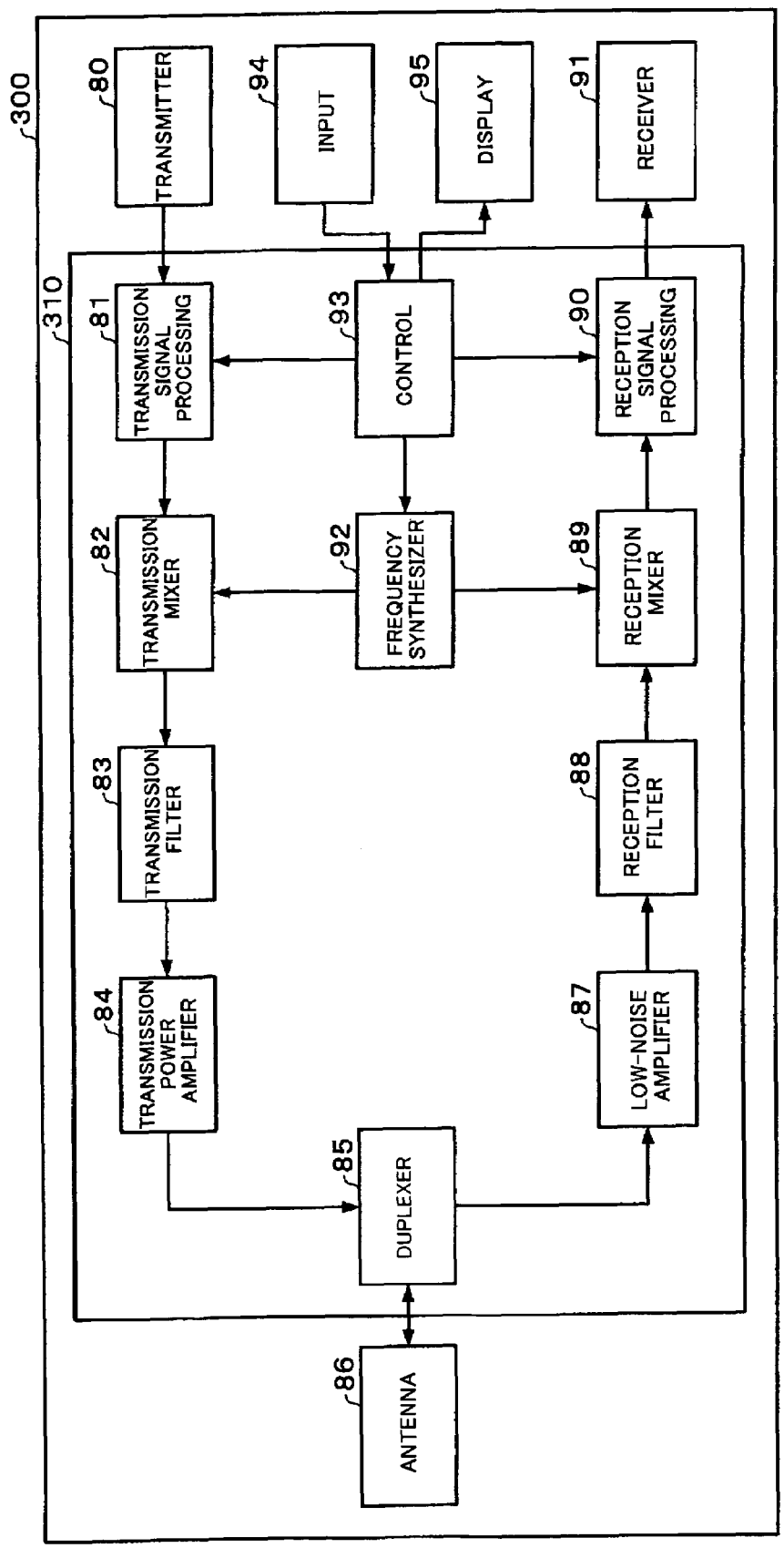
FIG. 20 is a block diagram showing a configuration of an electronic circuit according to an eighth embodiment of the invention.

An example of an electronic circuit and an electronic instrument according to an eighth embodiment of this invention is described below with reference to the drawings. FIG. 20 is a block diagram showing an electrical configuration of an electronic instrument 300 as an example of the eighth embodiment. The electronic instrument 300 is a portable telephone or the like.

The electronic instrument 300 includes an electronic circuit 310, a transmitter 80, a receiver 91, an input section 94, a display section 95, and an antenna section 86. The electronic circuit 310 includes a transmission signal processing circuit 81, a transmission mixer 82, a transmission filter 83, a transmission power amplifier 84, a duplexer 85, a low-noise amplifier 87, a reception filter 88, a reception mixer 89, a reception signal processing circuit 90, a frequency synthesizer 92, and a control circuit 93.

In the electronic circuit 310, the frequency filter shown in FIG. 14 may be used as the transmission filter 83 and the reception filter 88. The frequency to be filtered (frequency to be allowed to pass) is individually set for the transmission filter 83 and the reception filter 88 corresponding to the necessary frequency of the signal output from the transmission mixer 82 and the frequency necessary for the reception mixer 89. As the VCO 74 of the PLL circuit (see FIG. 19) provided in the frequency synthesizer 92, the oscillator shown in FIG. 15 or the VCSO shown in FIGS. 16 to 18 may be used.

The transmitter 80 is realized by using a microphone which converts a sound wave signal into an electric signal, for example. The transmission signal processing circuit 81 is a circuit which performs D/A conversion processing, modulation processing, or the like for an electric signal output from the transmitter 80. The transmission mixer 82 mixes the signal output from the transmission signal processing circuit 81 by using the signal output from the frequency synthesizer 92. The transmission filter 83 allows only a signal at a frequency for which an intermediate frequency (hereinafter abbreviated as "IF") is necessary to pass therethrough, and removes a signal at an unnecessary frequency. The signal output from the transmission filter 83 is converted into an RF signal by a conversion circuit (not shown). The transmission power amplifier 84 amplifies electric power of the RF signal output from the transmission filter 83, and outputs it to the duplexer 85.

The duplexer 85 outputs the RF signal output from the transmission power amplifier 84 to the antenna section 86, and transmits the RF signal from the antenna section 86 as electric waves. The duplexer 85 branches a signal received by the antenna section 86, and outputs the resulting signal to the low-noise amplifier 87. The low-noise amplifier 87 amplifies the signal received from the duplexer 85. The signal output from the low-noise amplifier 87 is converted into IF by a conversion circuit (not shown).

The reception filter 88 allows only a signal at a frequency for which IF converted by the conversion circuit (not shown) is necessary to pass therethrough, and removes a signal at an necessary frequency. The reception mixer 89 mixes the signal output from the reception filter 88 by using the signal output from the frequency synthesizer 92. The reception signal processing circuit 90 is a circuit which performs A/D conversion processing, demodulation processing, or the like for the signal output from the reception mixer 89. The receiver 91 is realized by using a small speaker which converts electric signals into sound waves, for example.

The frequency synthesizer 92 is a circuit which generates a signal supplied to the transmission mixer 82 and a signal supplied to the reception mixer 89. The frequency synthesizer 92 includes a PLL circuit, and generates a signal by dividing the frequency of a signal output from the PLL circuit. The control circuit 93 controls the transmission signal processing circuit 81, the reception signal processing circuit 90, the frequency synthesizer 92, the input section 94, and the display section 95. The display section 95 displays the state of the instrument for the user of the portable telephone, for example. The input section 94 allows the user of the portable telephone to input instructions, for example.

The above description is given taking an example of using a portable telephone as the electronic instrument and an electronic circuit provided in the portable telephone as the electronic circuit. However, the invention is not limited thereto. The invention may be applied to various mobile communication instruments and electronic circuits provided therein.

Moreover, the invention may be applied not only to the mobile communication instruments, but also to communication instruments used in a stationary state such as a tuner which receives BS or CS broadcasts and electronic circuits provided therein. Furthermore, the invention may be applied not only to the communication instruments which use electric waves propagated in air as the communication carrier, but also to electronic instruments, such as a HUB, which use a high-frequency signal propagated through a coaxial cable or an optical signal propagated through an optical cable and electronic circuits provided therein.

NINTH EMBODIMENT

An example of a thin-film piezoelectric resonator according to a ninth embodiment is described below with reference to the drawings.

Figure 21:
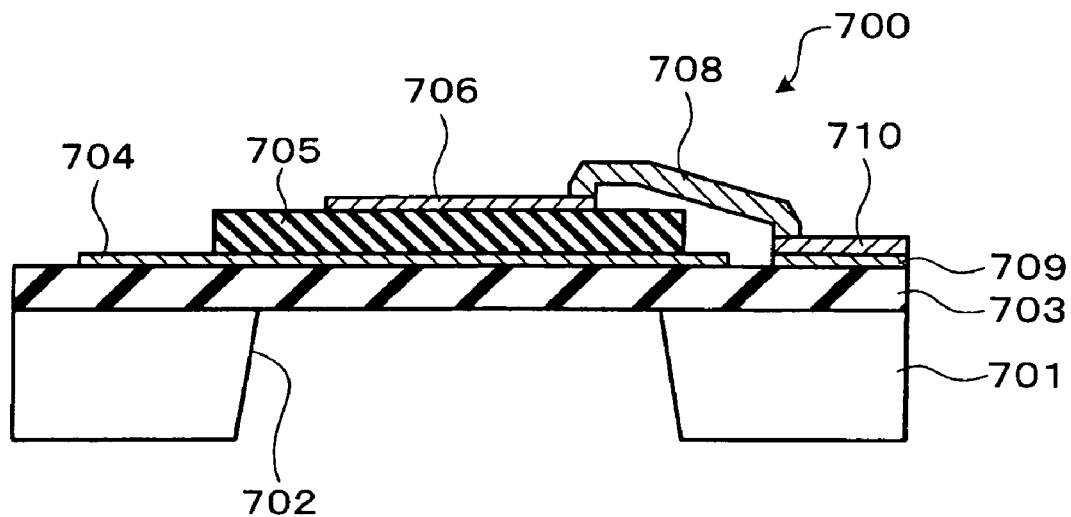
FIG. 21 is a side cross-sectional view showing a thin-film piezoelectric resonator according to a ninth embodiment of the invention.

FIG. 21 is a view schematically showing a first thin-film piezoelectric resonator 700 as an example of the ninth embodiment. The first thin-film piezoelectric resonator 700 is a diaphragm type thin-film piezoelectric resonator.

The first thin-film piezoelectric resonator 700 includes a substrate 701, an elastic layer 703, a first conductive layer 704, a piezoelectric layer 705, and a second conductive layer 706. The substrate 701, the elastic layer 703, the first conductive layer 704, the piezoelectric layer 705, and the second conductive layer 706 of the thin-film piezoelectric resonator 700 respectively correspond to the substrate 1, the stopper layer 2 and the hard layer 3, the first conductive layer 4, the piezoelectric layer 5, and the second conductive layer 6 of the piezoelectric device 1 shown in FIG. 1. Specifically, the first thin-film piezoelectric resonator 700 includes the piezoelectric device 10 shown in FIG. 1. The elastic layer 703 corresponds to the stopper layer 2 and the hard layer 3.

A via-hole 702 is formed through the substrate 701. An interconnect 708 is provided on the second conductive layer 706. The interconnect 708 is electrically connected with an electrode 709 formed on the elastic layer 703 through a pad 710.

Since the piezoelectric layer 705 exhibits excellent piezoelectric characteristics, the first thin-film piezoelectric resonator 700 according to the ninth embodiment has a high electromechanical coupling coefficient. Therefore, the thin-film piezoelectric resonator 700 can be used in a high-frequency region. Moreover, the thin-film piezoelectric resonator 700 can be reduced in size (thickness) and operated efficiently.

Figure 22:
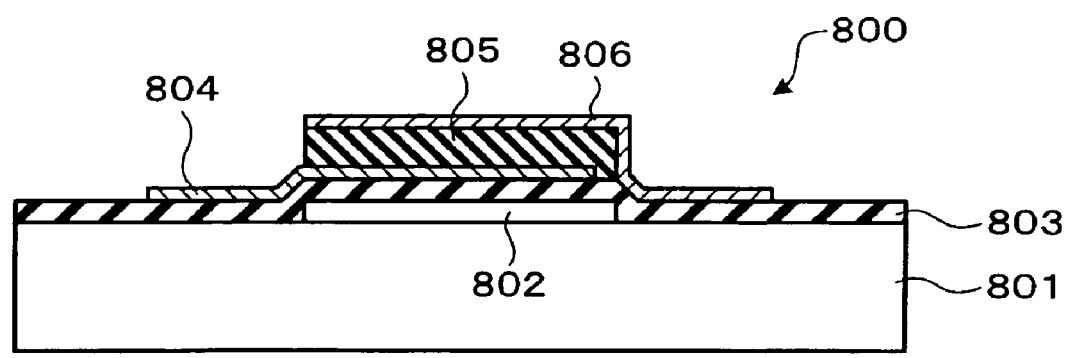
FIG. 22 is a side cross-sectional view showing a thin-film piezoelectric resonator according to the ninth embodiment.

FIG. 22 is a view schematically showing a second thin-film piezoelectric resonator 800 as another example of the ninth embodiment. The second thin-film piezoelectric resonator 800 differs from the first thin-film piezoelectric resonator 700 shown in FIG. 21 in that an air gap 802 is formed between a substrate 801 and an elastic layer 803 without forming a via-hole.

The second thin-film piezoelectric resonator 800 includes a substrate 801, an elastic layer 803, a first conductive layer 804, a piezoelectric layer 805, and a second conductive layer 806. The substrate 801, the elastic layer 803, the first conductive layer 804, the piezoelectric layer 805, and the second conductive layer 806 of the thin-film piezoelectric resonator 800 respectively correspond to the substrate 1, the stopper layer 2 and the hard layer 3, the first conductive layer 4, the piezoelectric layer 5, and the second conductive layer 6 of the piezoelectric device 1 shown in FIG. 1. Specifically, the second thin-film piezoelectric resonator 800 includes the piezoelectric device 10 shown in FIG. 1. The elastic layer 803 corresponds to the stopper layer 2 and the hard layer 3. The air gap 802 is the space formed between the substrate 801 and the elastic layer 803.

Since the piezoelectric layer 805 exhibits excellent piezoelectric characteristics, the second thin-film piezoelectric resonator 800 according to the ninth embodiment has a high electromechanical coupling coefficient. Therefore, the thin-film piezoelectric resonator 800 can be used in a high-frequency region. Moreover, the thin-film piezoelectric resonator 800 can be reduced in size (thickness) and operated efficiently.

The thin-film piezoelectric resonator according to the ninth embodiment (e.g. first thin-film piezoelectric resonator 700 and second thin-film piezoelectric resonator 800) can function as a resonator, a frequency filter, or an oscillator. For example, the thin-film piezoelectric resonator according to the ninth embodiment, which functions as a frequency filter, may be used as the transmission filter 83 and the reception filter 88 of the electronic circuit 310 shown in FIG. 20. The thin-film piezoelectric resonator according to the ninth embodiment, which functions as an oscillator, may be used as the oscillator of the frequency synthesizer 92.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. For example, the piezoelectric device according to the invention may be applied not only to the above-described devices, but also to various other devices. For example, the piezoelectric device according to the invention may be used as a lens drive piezoelectric actuator used in an optical zoom mechanism provided in a camera (including a camera provided in a portable telephone, a personal digital assistant (PDA), or the like).

What is claimed is:

1. A piezoelectric device comprising:
    a substrate;
    a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
    a piezoelectric layer formed over the first conductive layer and including a piezoelectric having a perovskite structure; and
    a second conductive layer electrically connected with the piezoelectric layer.

2. The piezoelectric device as defined in claim 1, wherein the first conductive layer includes at least one low-resistivity layer formed of a conductive material having a resistivity lower than a resistivity of the lanthanum nickelate.

3. The piezoelectric device as defined in claim 2, wherein the conductive material includes at least one of a metal, an oxide of the metal, and an alloy of the metal; and
wherein the metal is at least one of Pt, Ir, Ru, Ag, Au, Cu, Al, and Ni.

4. The piezoelectric device as defined in claim 1, wherein the first conductive layer includes a low-resistivity layer formed of a conductive material having a resistivity lower than a resistivity of the lanthanum nickelate, the buffer layer formed over the low-resistivity layer, and the conductive oxide layer formed over the buffer layer.

5. The piezoelectric device as defined in claim 1, wherein the conductive oxide layer is in contact with the piezoelectric layer.

6. The piezoelectric device as defined in claim 1, wherein the piezoelectric is shown by a general formula $ABO_3$, A including Pb, and B including at least one of Zr and Ti.

7. The piezoelectric device as defined in claim 6, wherein B further includes Nb.

8. The piezoelectric device as defined in claim 1, wherein the piezoelectric is a rhombohedral crystal or a mixed crystal of a tetragonal crystal and a rhombohedral crystal and is (001) preferentially oriented.

9. A piezoelectric actuator comprising a piezoelectric device,
wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

10. A piezoelectric pump comprising a piezoelectric device,
wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

11. An inkjet recording head comprising a piezoelectric device,
wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

12. An inkjet printer comprising a piezoelectric device,
wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

13. A surface acoustic wave device comprising a piezoelectric device,
wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

14. A thin-film piezoelectric resonator comprising a piezoelectric device,
wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

15. A frequency filter comprising a piezoelectric device, wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

16. An oscillator comprising a piezoelectric device, wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

17. An electronic circuit comprising a piezoelectric device,
wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

18. An electronic instrument comprising a piezoelectric device,
wherein the piezoelectric device includes:
a substrate;
a first conductive layer formed over the substrate, the first conductive layer including a conductive oxide layer formed of a (001) preferentially oriented lanthanum nickelate, and the lanthanum nickelate having oxygen deficiency, the first conductive layer including at least one buffer layer formed of a (001) preferentially oriented lanthanum-based layered perovskite compound, and the lanthanum-based layered perovskite compound including at least one of $La_2NiO_4$, $La_3Ni_2O_7$, $La_4Ni_3O_{10}$, $La_2CuO_4$, and a solid solution of at least two of $La_2NiO_4$, $La_3Ni_2O_7$, $La_4Ni_3O_{10}$, and $La_2CuO_4$;
a piezoelectric layer formed over the first conductive layer and including a piezoelectric having a perovskite structure; and
a second conductive layer electrically connected with the piezoelectric layer.

* * * * *